US008398892B2

(12) United States Patent
Shioi et al.

(10) Patent No.: US 8,398,892 B2
(45) Date of Patent: Mar. 19, 2013

(54) PHOSPHOR, METHOD FOR PRODUCING THE SAME AND LIGHT-EMITTING DEVICE USING THE SAME

(75) Inventors: Kousuke Shioi, Tsukuba (JP); Naoto Hirosaki, Tsukuba (JP); Hisayuki Miki, Chiba (JP)

(73) Assignees: Showa Denko K.K., Tokyo (JP); National Institute For Materials Science, Ibaraki (JP)

( * ) Notice: Subject to any disclaimer, the term of this patent is extended or adjusted under 35 U.S.C. 154(b) by 255 days.

(21) Appl. No.: 12/676,094

(22) PCT Filed: Sep. 1, 2008

(86) PCT No.: PCT/JP2008/065668
§ 371 (c)(1),
(2), (4) Date: Mar. 2, 2010

(87) PCT Pub. No.: WO2009/031495
PCT Pub. Date: Mar. 12, 2009

(65) Prior Publication Data
US 2010/0200874 A1  Aug. 12, 2010

(30) Foreign Application Priority Data

Sep. 3, 2007  (JP) ................. 2007-228243
Apr. 30, 2008  (JP) ................. 2008-118949
Aug. 22, 2008  (JP) ................. 2008-214366

(51) Int. Cl.
H01L 33/00 (2010.01)
C09K 11/64 (2006.01)
(52) U.S. Cl. ............... 252/301.4 F; 313/503; 257/98
(58) Field of Classification Search ............ 252/301.4 F; 313/503; 257/98
See application file for complete search history.

(56) References Cited

U.S. PATENT DOCUMENTS

| 6,577,073 | B2* | 6/2003 | Shimizu et al. | 315/246 |
| 2003/0030368 | A1* | 2/2003 | Ellens et al. | 313/503 |
| 2003/0094893 | A1 | 5/2003 | Ellens et al. | |
| 2005/0012075 | A1 | 1/2005 | Sakata et al. | |
| 2006/0043337 | A1 | 3/2006 | Sakane et al. | |
| 2006/0186377 | A1 | 8/2006 | Takahashi et al. | |
| 2006/0197439 | A1* | 9/2006 | Sakane et al. | 313/503 |
| 2006/0220047 | A1 | 10/2006 | Nagatomi et al. | |
| 2007/0007494 | A1 | 1/2007 | Hirosaki et al. | |
| 2007/0018567 | A1 | 1/2007 | Hirosaki | |
| 2008/0185602 | A1* | 8/2008 | Park et al. | 257/98 |

FOREIGN PATENT DOCUMENTS

| CN | 1918262 | | 2/2007 |
| JP | 05-152609 | A | 6/1993 |
| JP | 07-099345 | A | 4/1995 |
| JP | 09-153644 | A | 6/1997 |
| JP | 10-012925 | A | 1/1998 |
| JP | 10-93146 | * | 4/1998 |
| JP | 2927279 | B2 | 5/1999 |
| JP | 2000-034477 | A | 2/2000 |
| JP | 2002-171000 | A | 6/2002 |
| JP | 3364229 | B2 | 10/2002 |
| JP | 2002-363554 | A | 12/2002 |
| JP | 2004-277663 | A | 10/2004 |
| JP | 2005-008793 | A | 1/2005 |
| JP | 2005-036038 | A | 2/2005 |
| JP | 2005-255895 | A | 9/2005 |
| JP | 2006-057018 | A | 3/2006 |
| JP | 2006-232868 | A | 9/2006 |
| JP | 2007-112650 | A | 5/2007 |
| JP | 2007-113019 | A | 5/2007 |
| JP | 2007-169428 | A | 7/2007 |
| WO | WO 2005103199 | A1 | 11/2005 |

OTHER PUBLICATIONS

European Search Report dated Nov. 7, 2011 for corresponding European Patent Application No. EP 08 82 9849.
Taiwanese Office Action Dated Apr. 18, 2012 includes Notification For the Opinion of Examination submitted by Taiwanese Patent Office.

* cited by examiner

*Primary Examiner* — Carol M Koslow
(74) *Attorney, Agent, or Firm* — Sughrue Mion, PLLC

(57) ABSTRACT

The invention is a phosphor which includes a phosphor material having a composition represented by a general formula: $M(0)_a M(1)_b M(2)_{x-(vm+n)} M(3)_{(vm+n)-y} O_n N_{z-n}$, wherein $M(0)$ is one or more elements selected from Li, Na, Be, Mg, Ca, Sr, Ba, Sc, Y, La, Gd and Lu; $M(1)$ is one or more activators selected from Mn, Ce, Pr, Nd, Sm, Eu, Tb, Dy, Ho, Er, Tm and Yb; $M(2)$ is one or more elements selected from Si, Ge, Sn, Ti, Hf and Zr; $M(3)$ is one or more elements selected from Be, B, Al, Ga, In, Tl and Zn; O is oxygen; N is nitrogen; and an atomic ratio of $M(0)$, $M(1)$, $M(2)$, $M(3)$, O and N is adjusted to satisfy the following: x, y and z satisfy $33 \leq x \leq 51$, $8 \leq y \leq 12$ and $36 \leq z \leq 56$; a and b satisfy $3 \leq a+b \leq 7$ and $0.001 \leq b \leq 1.2$; m and n satisfy $0.8 \cdot me \leq m \leq 1.2 \cdot me$ and $0 \leq n \leq 7$ in which $me=a+b$; and v satisfies $v=\{a \cdot v(0)+b \cdot v(1)\}/(a+b)$ (wherein $v(0)$ is a valence of $M(0)$ ion and $v(1)$ is a valence of $M(1)$ ion). The invention also relates to a method for producing the phosphor and a light-emitting device using the phosphor.

14 Claims, 7 Drawing Sheets

PHOSPHOR, METHOD FOR PRODUCING THE SAME AND LIGHT-EMITTING DEVICE USING THE SAME

TECHNICAL FIELD

The present invention relates to a phosphor consisting mainly of an inorganic compound and usage thereof. More particularly, the usage relates to light-emitting devices, such as a lighting device and a display device which uses a property of the phosphor, i.e., property of emitting fluorescent light at a wavelength of not less than 400 nm.

BACKGROUND ART

Generally, a phosphor is used in light-emitting devices of display devices such as a vacuum fluorescent display (VFD), a field emission display (FED), a plasma display panel (PDP), a cathode-ray tube (CRT) and a light emitting diode (i.e., a LED device).

In these light-emitting devices, it is necessary to supply certain energy to the phosphor in order to excite the phosphor and cause the phosphor to emit light. The phosphor is excited by an excitation source with high energy, such as a vacuum ultraviolet ray, an ultraviolet ray, an electron ray or a blue light and is caused to emit visible light.

In the light-emitting devices using related art phosphors, such as silicate phosphor, phosphate phosphor, aluminate phosphor and sulfide phosphor, however, there has been a problem that brightness of the phosphor is impaired when exposed to the excitation sources described above.

It has been desirable to provide a phosphor of which brightness is not impaired when exposed to the excitation sources described above. An oxynitride phosphor, such as a sialon phosphor, has been proposed as a phosphor of which brightness is hardly impaired.

Patent Document 1 discloses a sialon phosphor including Ca. The sialon phosphor is produced in a process described below. Silicon nitride ($Si_3N_4$), aluminum nitride (AlN), calcium carbonate ($CaCO_3$) and europium oxide ($Eu_2O_3$) are first mixed at a predetermined molar ratio. The obtained mixture is sintered through hot pressing. In particular, the mixture is kept in a one atmosphere (i.e., 0.1 MPa) nitrogen atmosphere for one hour at a temperature of 1700° C.

An $\alpha$-sialon phosphor, in which Eu ions are dissolved, obtained in this process is excited by 450 to 500-nm blue light to emit 550 to 600-nm yellow light. A blue LED device and this phosphor are combined to produce a white LED device.

Patent Document 2 relates to another sialon phosphor and discloses a $\beta$-sialon phosphor which has a $\beta$-$Si_3N_4$ structure. This $\beta$ type sialon phosphor is excited by near-ultraviolet to blue light to emit 500 to 600-nm green to orange light and is thus suitably used as a phosphor for white LED devices.

Patent Document 3 discloses an oxynitride phosphor of a JEM phase. This oxynitride phosphor is excited by near-ultraviolet to blue light to emit light having a light emission wavelength peak in 460 to 510 nm. The excitation and light emitting wavelength regions of the disclosed phosphor are suitable for a blue phosphor incorporated in a white LED excited by a near-ultraviolet LED.

A white light emitting diode in which a blue light emitting diode device and a blue light-absorbing yellow light-emitting phosphor are combined is well-known as a related art light-emitting device used for a lighting device. This white light emitting diode is practically used for various lighting.

For example, Patent Document 4 discloses a white light emitting diode in which a blue light emitting diode device and a blue light-absorbing yellow light-emitting phosphor are combined. Patent Document 5 discloses a light emitting diode of a similar configuration. Patent Document 6 discloses a light-emitting device in which a wavelength converting casting material is used in a light emitting diode of a similar configuration.

A phosphor used especially frequently in these light emitting diodes is a cerium-activated yttrium aluminum garnet-based phosphor represented by a general formula: $(Y, Gd)_3(Al, Ga)_5O_{12}:Ce_{3+}$.

Patent Document 7 discloses a light emitting diode with a phosphor. The light emitting diode includes a semiconductor light-emitting device emitting ultraviolet light or near-ultraviolet light and a phosphor. In this light emitting diode with a phosphor, the semiconductor light-emitting device emits ultraviolet light or near-ultraviolet light by a pulse-form high current. The light emitted from the semiconductor light-emitting device excites the phosphor formed as a film on a surface of the semiconductor light-emitting device. In this configuration, the light emitting diode with a phosphor can emit either of blue light, green light or red light in accordance with a type of the phosphor formed on the surface of the semiconductor light-emitting device.

Patent Document 8 discloses a dot matrix display device which includes a light emitting layer and three types of phosphor layers. The light emitting layer consists of a group III nitride semiconductor. The phosphor layers receive ultraviolet light with a 380-nm peak wavelength emitted from the light emitting layer and each emits trichromatic red, green or blue light.

Patent Document 9 discloses a semiconductor light-emitting device which emits white light using a semiconductor light-emitting device emits 390 to 420-nm light and a phosphor excited by the light emitted from the semiconductor light-emitting device. Since the semiconductor light-emitting device emits light which is not highly visible for human being, a viewer hardly feels variation in a color tone due to any change in light emitting intensity and a light emission wavelength of the semiconductor light-emitting device. The 390 to 420-nm light hardly damages device components, such as resin in which a phosphor is dispersed. Although ultraviolet light generally has various harmful influences on human bodies, light at a wavelength of not less than 390 nm has no harmful influence caused by escaping excitation light. Examples of the phosphor excited by 390 to 420-nm light to emit light include various oxide phosphors and sulfide phosphors.

Such a lighting device can be fabricated by publicly known methods as disclosed in, for example, Patent Documents 10 and 11.

[Patent Document 1] Japanese Unexamined Patent Application, First Publication No. 2002-363554
[Patent Document 2] Japanese Unexamined Patent Application, First Publication No. 2005-255895
[Patent Document 3] Japanese Unexamined Patent Application, First Publication No. 2006-232868
[Patent Document 4] Japanese Patent No. 2900928
[Patent Document 5] Japanese Patent No. 2927279
[Patent Document 6] Japanese Patent No. 3364229
[Patent Document 7] Japanese Unexamined Patent Application, First Publication No. 1998-12925
[Patent Document 8] Japanese Unexamined Patent Application, First Publication No. 1997-153644
[Patent Document 9] Japanese Unexamined Patent Application, First Publication No. 2002-171000
[Patent Document 10] Japanese Unexamined Patent Application, First Publication No. H5-152609

[Patent Document 11] Japanese Unexamined Patent Application, First Publication No. H7-99345

The phosphors disclosed in Patent Documents 1 to 11 have an excitation spectrum and a light emission spectrum suitable for a white LED excited by a near-ultraviolet to blue light device. However, the advent of a phosphor having still higher brightness has been desired due to a recently increasing demand for a still brighter white LED.

Regarding light-emitting devices, such as lighting, there is a problem that a white light emitting diode formed by a blue light emitting diode device and an yttrium aluminum garnet-based phosphor is characterized by emitting bluish white light due to shortage of a red component and thus the color rendering becomes ununiform. In such a white light emitting diode, especially an oxide phosphor has a low covalent bond property. Accordingly, there has been a problem that light emission brightness is impaired due to an increase in the heat generation rate of a high-brightness semiconductor light-emitting device.

A sulfide-based phosphor is known to have high light emission brightness, but is chemically unstable. It is therefore difficult to provide a long-life characteristic inherent to a white LED.

DISCLOSURE OF INVENTION

The invention has been made in view of the aforementioned circumstances and an object thereof is to provide a phosphor having greater brightness and stability than those of the related art phosphors, a method for producing the same and a light-emitting device using the same.

After intensive studies in order to solve the above problems, the present inventors finally found out that the following phosphor emits light with high brightness. The phosphor includes a phosphor material having a composition represented by a general formula: $M(0)_a M(1)_b M(2)_{x-(vm+n)} M(3)_{(vm+n)-y} O_n N_{z-n}$, wherein M(0) is one or more elements selected from Li, Na, Be, Mg, Ca, Sr, Ba, Sc, Y, La, Gd and Lu; M(1) is one or more activators selected from Mn, Ce, Pr, Nd, Sm, Eu, Tb, Dy, Ho, Er, Tm and Yb; M(2) is one or more elements selected from Si, Ge, Sn, Ti, Hf and Zr; M(3) is one or more elements selected from Be, B, Al, Ga, In, Tl and Zn; O is oxygen; N is nitrogen; and the atomic ratio of M(0), M(1), M(2), M(3), O and N is adjusted to satisfy the following: x, y and z satisfy $33 \leq x \leq 51$, $8 \leq y \leq 12$ and $36 \leq z \leq 56$; a and b satisfy $3 \leq a+b \leq 7$ and $0.001 \leq b \leq 1.2$; m and n satisfy $0.8 \cdot me \leq m \leq 1.2 \cdot me$ and $0 \leq n \leq 7$ in which me=a+b; and v satisfies $v=\{a \cdot v(0)+b \cdot v(1)\}/(a+b)$ (wherein v(0) is a valence of M(0) ion and v(1) is a valence of M(1) ion).

After intensive study, the present inventors finally completed the invention which has the following configurations:

(1) A phosphor which includes a phosphor material having a composition represented by a general formula: $M(0)_a M(1)_b M(2)_{x-(vm+n)} M(3)_{(vm+n)-y} O_n N_{z-n}$, wherein M(0) is one or more elements selected from Li, Na, Be, Mg, Ca, Sr, Ba, Sc, Y, La, Gd and Lu; M(1) is one or more activators selected from Mn, Ce, Pr, Nd, Sm, Eu, Tb, Dy, Ho, Er, Tm and Yb; M(2) is one or more elements selected from Si, Ge, Sn, Ti, Hf and Zr; M(3) is one or more elements selected from Be, B, Al, Ga, In, Tl and Zn; O is oxygen; N is nitrogen; and an atomic ratio of M(0), M(1), M(2), M(3), O and N is adjusted to satisfy the following: x, y and z satisfy $33 \leq x \leq 51$, $8 \leq y \leq 12$ and $36 \leq z \leq 56$; a and b satisfy $3 \leq a+b \leq 7$ and $0.001 \leq b \leq 1.2$; m and n satisfy $0.8 \cdot me \leq m \leq 1.2 \cdot me$ and $0 \leq n \leq 7$ in which me=a+b; and v satisfies $v=\{a \cdot v(0)+b \cdot v(1)\}/(a+b)$ (wherein v(0) is a valence of M(0) ion and v(1) is a valence of M(1) ion).

(2) The phosphor as recited in (1), wherein x=42, y=10 and z=46.

(3) The phosphor as recited in (1) or (2), wherein M(0) is one or more elements selected from Ca, Sr and Ba.

(4) The phosphor as recited in any one of (1) to (3), wherein M(1) is Eu.

(5) The phosphor as recited in any one of (1) to (4), wherein M(2) is Si and M(3) is Al.

(6) The phosphor as recited in any one of (1) to (5), wherein $n \leq me$.

(7) The phosphor as recited in any one of (1) to (6), wherein the content of the phosphor material is not less than 80% by volume and the remainder is one or more selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1) and $SrSi_6N_8$.

(8) The phosphor as recited in any one of (1) to (7), wherein the phosphor is a powder with an average particle diameter of not less than 0.1 um to not more than 50 μm.

(9) The phosphor as recited in any one of (1) to (8), wherein the average aspect ratio is not more than 20.

(10) The phosphor as recited in any one of (1) to (9), further including 5 to 300 ppm of fluorine.

(11) The phosphor as recited in any one of (1) to (10), further including 10 to 3000 ppm of boron.

(12) The phosphor as recited in any one of (1) to (11), wherein a transparent film is formed at least partially on a surface of the phosphor and the thickness of the transparent film is $(10 \text{ to } 180)/n_k$ (nanometers) when the refractive index of the transparent film is $n_k$.

(13) The phosphor as recited in (12), wherein the refractive index $n_k$ of the transparent film is not less than 1.2 and not more than 2.5.

(14) The phosphor as recited in (12) or (13), wherein the refractive index $n_k$ of the transparent film is not less than 1.5 and not more than 2.0.

(15) A method for producing a phosphor, the method comprising: a kneading step in which a raw material is kneaded to provide a raw material mixture; a sintering step in which the raw material mixture is sintered; and a heat treatment step in which the sintered raw material mixture is heat-treated.

(16) The method for producing a phosphor as recited in (15), further comprising a step of grinding and classifying a mass of the sintered raw material mixture before the heat treatment step, and another step of grinding and classifying a mass of a heat-treated product after the ground and classified mass of the raw material mixture is heat-treated in the heat treatment step.

(17) The method for producing a phosphor as recited in (15) or (16), wherein a starting material comprises at least one or more M-containing materials selected from $MSi_2$, $MSiN_2$, $M_2Si_5N_8$, $M_3Al_2N_4$ and $MSi_6N_8$, wherein M is one or more divalent elements selected from M(0) and M(1).

(18) The method for producing a phosphor as recited in any one of (15) to (17), wherein at least $LiSi_2N_3$ is included as a starting material.

(19) The method for producing a phosphor as recited in any one of (15) to (18), wherein phosphor powder having a phosphor material of a target composition is produced in advance and the phosphor powder is added to the raw material mixture as a seed.

(20) The method for producing a phosphor as recited in any one of (16) to (19), wherein the mass of the sintered raw material mixture is ground until the average particle diameter is not more than 50 μm using a grinder consisting of a grinding medium or a lining material of a alumina sintered product, a zirconium oxide sintered product, a silicon nitride sintered product or an α-sialon sintered product.

(21) The method for producing a phosphor as recited in any one of (16) to (20), wherein the mass of the sintered raw material mixture is ground until the average particle diameter becomes not more than 20 μm using a grinder consisting of a grinding medium or a lining material of a alumina sintered product, a zirconium oxide sintered product, a silicon nitride sintered product or an α-sialon sintered product.

(22) The method for producing a phosphor as recited in any one of (16) to (21), further including classifying a ground product of the mass of the sintered raw material mixture through elutriation.

(23) The method for producing a phosphor as recited in any one of (16) to (22), further comprising classifying a ground product of the mass of the sintered heat-treated product through elutriation.

(24) The method for producing a phosphor as recited in any one of (15) to (23), further comprising a granulating step in which a grain size of an aggregate of the raw material powder is adjusted by spray drying the raw material mixture.

(25) The method for producing a phosphor as recited in any one of (15) to (24), wherein the kneading includes kneading the raw material powder together with a solvent in a wet mill.

(26) The method for producing a phosphor as recited in any one of (15) to (25), wherein, in the sintering step, the raw material mixture is sintered in a nitrogen atmosphere with pressure of not less than 0.1 MPa and not more than 100 MPa and at a temperature of not less than 1500° C. and not more than 2200° C.

(27) The method for producing a phosphor as recited in any one of (15) to (26), wherein, in the sintering step, the raw material mixture is sintered in the presence of carbon or a carbon-including compound.

(28) The method for producing a phosphor as recited in any one of (15) to (27), wherein, in the sintering step, the raw material mixture is accommodated in a sintering vessel and sintered therein.

(29) The method for producing a phosphor as recited in any one of (15) to (28), wherein, in the sintering step, the raw material is sintered while a filling factor is kept to be not more than 40% in bulk density.

(30) The method for producing a phosphor as recited in any one of (15) to (29), wherein, in the sintering step, the raw material is sintered while a filling factor is kept to be not lower than 20% by volume as a ratio of bulk volume of the raw material mixture to volume of the sintering vessel.

(31) The method for producing a phosphor as recited in any one of (15) to (30), wherein the sintering vessel is made of any one of alumina, calcia, magnesia, graphite or boron nitride.

(32) The method for producing a phosphor as recited in any one of (15) to (31), wherein, in the heat treatment step, the raw material mixture is heat-treated in one or more atmospheres selected from a nitrogen atmosphere, an ammonia atmosphere and a hydrogen atmosphere at a temperature of not less than 600° C. and not more than 2200° C.

(33) The method for producing a phosphor as recited in any one of (15) to (32), further including a transparent film forming step in which phosphor powder is made to be suspended in an organic solvent, and an organic metal complex or metal alkoxide is add dropwise to the organic solvent so as to form a transparent film at least partially on a surface of the phosphor.

(34) The method for producing a phosphor as recited in any one of (15) to (32), further including a transparent film forming step in which phosphor powder is suspended in water and a metallic salt aqueous solution is added dropwise to the suspension so as to form a transparent film at least partially on a surface of the phosphor.

(35) A light-emitting device including a light emitting source and a phosphor, wherein the phosphor is the phosphor as recited in any one of (1) to (14).

(36) The light-emitting device as recited in (35), including a light emitting source and a phosphor, wherein $CaAlSiN_3$:Eu is used as the phosphor.

(37) The light-emitting device as recited in (35) or (36), wherein the light emitting source is one of a LED chip, an inorganic EL chip or an organic EL chip, each of which emits light at a wavelength of 330 to 500 nm.

(38) The light-emitting device as recited in (37), wherein the light emission wavelength of the LED chip having a maximum intensity is in the range of 330 to 500 nm.

(39) The light-emitting device as recited in (37) or (38), wherein the LED chip emits ultraviolet light.

(40) The light-emitting device as recited in (37) or (38), wherein the maximum intensity of the light emission wavelength of the LED chip is 380 to 410 nm.

(41) The light-emitting device as recited in (37), (38) or (40), wherein the LED chip emits blue light.

(42) The light-emitting device as recited in any one of (37) to (41), wherein a white LED device is fabricated when the phosphor is excited by the LED chip.

(43) The light-emitting device as recited in (42), wherein the color rendering property of white light emitted from the LED device is not less than 70.

(44) The light-emitting device as recited in (42) or (43), wherein the half width of the light emission spectrum of the LED device is not less than 100 nm.

(45) The light-emitting device as recited in (38) or (39), wherein a colored LED device is fabricated when the phosphor is excited by the LED chip which emits ultraviolet light.

(46) The light-emitting device as recited in (45), wherein a green LED device is fabricated when the phosphor is excited by the LED chip which emits ultraviolet light.

(47) The light-emitting device as recited in (45), wherein a blue-green LED device is fabricated when the phosphor is excited by the LED chip which emits ultraviolet light.

(48) The light-emitting device as recited in (45), wherein a blue LED device is fabricated when the phosphor is excited by the LED chip which emits ultraviolet light.

(49) The light-emitting device as recited in any one of (37) to (48), wherein the light-emitting device is either a round-type LED device or a surface mounting-type LED device.

(50) The light-emitting device as recited in (49), wherein the light-emitting device is a Chip On Board device in which the LED chip is mounted directly on a wired substrate.

(51) The light-emitting device as recited in any one of (37) to (50), wherein a resin is included in a substrate and/or a reflector section of the light-emitting device.

(52) The light-emitting device as recited in (51), wherein the resin is a thermosetting resin.

(53) The light-emitting device as recited in any one of (37) to (52), wherein a ceramic member is included in a substrate and/or a reflector section of the light-emitting device.

(54) The light-emitting device as recited in any one of (35) to (53), wherein the phosphor is dispersed in sealing resin formed to surround the LED chip.

(55) The light-emitting device as recited in (54), wherein the sealing resin at least partially includes silicone resin.

(56) The light-emitting device as recited in (54) or (55), wherein the sealing resin at least partially includes methyl silicone resin.

(57) The light-emitting device as recited in any one of (54) to (56), wherein the sealing resin at least partially includes phenyl silicone resin.

(58) The light-emitting device as recited in any one of (54) to (57), wherein the phosphor is dispersed in the sealing resin so that the phosphor exist at a high density near the LED chip.

(59) The light-emitting device as recited in any one of (54) to (58), wherein another sealing resin is formed to cover the sealing resin.

(60) The light-emitting device as recited in any one of (37) to (59), wherein the phosphor is attached directly to the LED chip.

(61) The light-emitting device as recited in (60), wherein the phosphor is attached directly to the LED chip so as to cover at least a surface of the LED chip.

(62) The light-emitting device as recited in (61), wherein the phosphor has a layered structure.

(63) The light-emitting device as recited in (62), wherein the thickness of the phosphor is from 1 μm to 100 μm.

(64) The light-emitting device as recited in any one of (37) to (63), wherein the area of the LED chip is larger than a 350 μm×350 μm.

(65) The light-emitting device as recited in any one of (37) to (64), wherein the light-emitting device includes a plurality of LED chips.

(66) The light-emitting device as recited in any one of (37) to (65), wherein the light-emitting device is used with electric power of not less than 0.2 W for each package.

(67) The light-emitting device as recited in any one of (37) to (66), wherein the LED chip is used with electric power of not less than $1.5 \times 10^4$ W/m$^2$ for each package in plane area density.

(68) The light-emitting device as recited in any one of (37) to (66), wherein the LED chip is used with electric power of not less than $5 \times 10^4$ W/m$^2$ for each package in plane area density.

EFFECTS OF THE INVENTION

According to the above-described configuration, in which a phosphor having a brightness higher than the phosphor in the related art, and having excellent stability are illustrated, a method for producing and light-emitting device using it can be provided.

The phosphor according to the invention has a composition represented by a general formula: $M(0)_a M(1)_b M(2)_{x-(vm+n)} M(3)_{(vm+n)-y} O_n N_{z-n}$, wherein M(0) is one or more elements selected from Li, Na, Be, Mg, Ca, Sr, Ba, Sc, Y, La, Gd and Lu; M(1) is one or more activators selected from Mn, Ce, Pr, Nd, Sm, Eu, Tb, Dy, Ho, Er, Tm and Yb; M(2) is one or more elements selected from Si, Ge, Sn, Ti, Hf and Zr; M(3) is one or more elements selected from Be, B, Al, Ga, In, Ti and Zn; O is oxygen; N is nitrogen; and the atomic ratio of M(0), M(1), M(2), M(3), O and N is adjusted to satisfy the following: x, y and z satisfy $33 \leq x \leq 51$, $8 \leq y \leq 12$ and $36 \leq z \leq 56$; a and b satisfy $3 \leq a+b \leq 7$ and $0.001 \leq b \leq 1.2$; m and n satisfy $0.8 \cdot me \leq m \leq 1.2 \cdot me$ and $0 \leq n \leq 7$ in which me=a+b; and v satisfies $v = \{a \cdot v(0) + b \cdot v(1)\}/(a+b)$ (wherein v(0) is a valence of M(0) ion and v(1) is a valence of M(1) ion). With this configuration, light emitting intensity with sufficiently high brightness can be provided.

The phosphor according to the invention is formed of the phosphor described above and other materials. The phosphor described above is included in an amount of not less than 80% by volume. The remainder is one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}$ $Al_{(18+n)}O_n N_{(32-n)}$ (n~1) and $SrSi_6N_8$. With this configuration, a sufficiently high light emitting intensity is obtained.

The phosphor according to the invention is powder having an average particle diameter of not less than 0.1 μm to not more than 50 μm. Accordingly, the phosphor is free of influence regarding surface defects. Absorption of excitation light of the phosphor is sufficient and high-intensity light emission is thus obtained.

In the phosphor according to the invention, an average aspect ratio of primary particles constituting the phosphor is not more than 20. Such an average aspect ratio provides increased dispersibility of the phosphor to resin, an efficient absorption of excitation light and a sufficiently high light emitting intensity.

The phosphor according to the invention includes a small amount of fluorine and boron as impurities. Light emitting intensity is further increased.

In the method for producing the phosphor according to the invention, at least one or more M-containing materials selected from $MSi_2$, $MSiN_2$, $M_2Si_5N_8$, $M_3Al_2N_4$ and $MSi_6N_8$, is employed as a starting material (M is one or more divalent elements selected from M(0) and M(1)). Accordingly, the reactivity in a sintering step can be increased and thus a phosphor with higher brightness can be provided.

In the method for producing the phosphor according to the invention, $LiSi_2N_3$, which is a compound containing Li, is included at least as a starting material. Accordingly, reactivity in a sintering step can be increased and thus a phosphor with higher brightness can be provided.

In the method for producing the phosphor according to the invention, a phosphor powder having a targeted composition previously synthesized as a seed is added to a raw material mixture. Accordingly, a synthetic reaction is promoted to enable preparation at a low temperature. A phosphor with higher crystallinity is obtained and light emitting intensity of the phosphor is increased.

If necessary, flux may be added and mixed to the raw material compound. Examples of the flux include a halide of alkaline metal or a halide of alkaline-earth metal. The flux is added in an amount of, for example, 0.01 to 20 parts by mass with respect to 100 parts by mass of the raw material of the phosphor.

An aggregate of the raw material powder mixture can be obtained in a kneading step in which a raw material powder is kneaded with a solvent in a wet mill and a granulating step in which grain size of the aggregate of the raw material powder is adjusted by spray drying the kneaded material obtained in the kneading step using a spray dryer.

In the method for producing the phosphor according to the invention, the sintering step is performed in a nitrogen atmosphere at pressure of not less than 0.1 MPa to not more than 100 MPa at a temperature of not less than 1500° C. to not more than 2200° C. Since atmosphere pressure is high, volatilization or disorder in composition of the raw material compound does not occur. Since the temperature is sufficiently high, time efficiency is high and no raw material fuses. Accordingly, a phosphor with high light emitting intensity is obtained.

In the method for producing the phosphor according to the invention, the sintering step is performed under coexistence of carbon or a carbon-including compound. Since the raw material mixture touches a reducing atmosphere, a phosphor with high brightness is obtained especially when a raw material compound with a large oxygen content is used.

In the method for producing the phosphor according to the invention, the sintering step is performed with the raw material being filled at a filling factor of not more than 40% in bulk density. In this manner, demands for both economical efficiency and quality can be satisfied.

In order to keep the aggregate of the raw material powder mixture to be filled at a bulk density of not more than 40%, the aggregate powder granulated in the granulating step may be placed and sintered in a sintering vessel.

In the method for producing the phosphor according to the invention, the sintering step is performed with the raw material being filled at a filling factor of not less than 20% by volume as the ratio of bulk volume of the raw material mixture to the volume of the sintering vessel. In this manner, a phosphor with high brightness is obtained.

In the method for producing the phosphor according to the invention, the sintered mass of the raw material mixture is ground until the average particle diameter becomes not more than 20 μm using a grinder consisting of a grinding medium or a lining material of a alumina sintered product, a zirconium oxide sintered product, a silicon nitride sintered product or an α-sialon sintered product. Accordingly, ingression of impurities in the grinding step can be prevented.

In the method for producing the phosphor according to the invention, the heat treatment step is performed in one or more atmospheres selected from nitrogen, ammonia and hydrogen at a temperature of not less than 600° C. to not more than 2200° C. Accordingly, defects introduced in the grinding step can be decreased and thus light emitting intensity can be recovered.

The phosphor according to the invention has a composition represented by a general formula: $M(0)_a M(1)_b M(2)_{x-(vm+n)} M(3)_{(vm+n)-y} O_n N_{z-n}$, wherein M(0) is one or more elements selected from Li, Na, Be, Mg, Ca, Sr, Ba, Sc, Y, La, Gd and Lu; M(1) is one or more activators selected from Mn, Ce, Pr, Nd, Sm, Eu, Tb, Dy, Ho, Er, Tm and Yb; M(2) is one or more elements selected from Si, Ge, Sn, Ti, Hf and Zr; M(3) is one or more elements selected from Be, B, Al, Ga, In, Ti and Zn; O is oxygen; N is nitrogen; and the atomic ratio of M(0), M(1), M(2), M(3), O and N is adjusted to satisfy the following: x, y and z satisfy $33 \leq x \leq 51$, $8 \leq y \leq 12$ and $36 \leq z \leq 56$; a and b satisfy $3 \leq a+b \leq 7$ and $0.001 \leq b \leq 1.2$; m and n satisfy $0.8 \cdot me \leq m \leq 1.2 \cdot me$ and $0 \leq n \leq 7$ in which me=a+b; and v satisfies $v\{a \cdot v(0)+b \cdot v(1)\}/(a+b)$ (wherein v(0) is a valence of M(0) ion and v(1) is a valence of M(1) ion). The oxygen content of the phosphor powder according to the invention may, however, be larger than that calculated on the basis of the general formula. The differential oxygen content is not more than 0.4% by mass. The differential oxygen constitutes a transparent film formed at least partially on surfaces of the powder particles of the phosphor according to the invention.

The phosphor according to the invention has a transparent film having a thickness of 10 to $180/n_k$ (nanometers) at least partially on the surfaces of the particles which constitute the phosphor described above. Here, $n_k$ is 1.2 to 2.5 in a refractive index of the transparent film. With this configuration, oxidation resistance of the phosphor particle increases, the difference in the refractive index between the phosphor and the sealing resin decreases and light loss in an interface between the phosphor and the sealing resin decreases. The refractive index $n_k$ of the transparent film is preferably not less than 1.5 to not more than 2.0.

In order to form a transparent film at least partially on the surfaces of the powder particles of the phosphor according to the invention, the phosphor according to the invention may be suspended in an organic solvent, to which an organic metal complex or metal alkoxide is added dropwise, or the phosphor according to the invention may be suspended in water, to which a metallic salt aqueous solution may be added dropwise while the pH is kept constant.

The light-emitting device according to the invention is formed by a light emission source and a phosphor, which is according to the invention. Accordingly, a light-emitting device with sufficiently high brightness and a high color rendering index is provided.

A light emission source of the light-emitting device according to the invention is a LED chip, an inorganic EL chip or an organic EL chip which emits 330 to 500-nm light. A phosphor according to the invention is excited efficiently and therefore a light-emitting device with a higher brightness and a higher color rendering index is provided.

The light-emitting device according to the invention is formed by a light emission source and a phosphor. The phosphor according to the invention and $CaAlSiN_3:Eu$ are employed as the phosphor. Accordingly, a light-emitting device which emits warm white light with a strong red component to orange light is provided.

REFERENCE NUMERALS IN THE FIGURES

Figure 1:
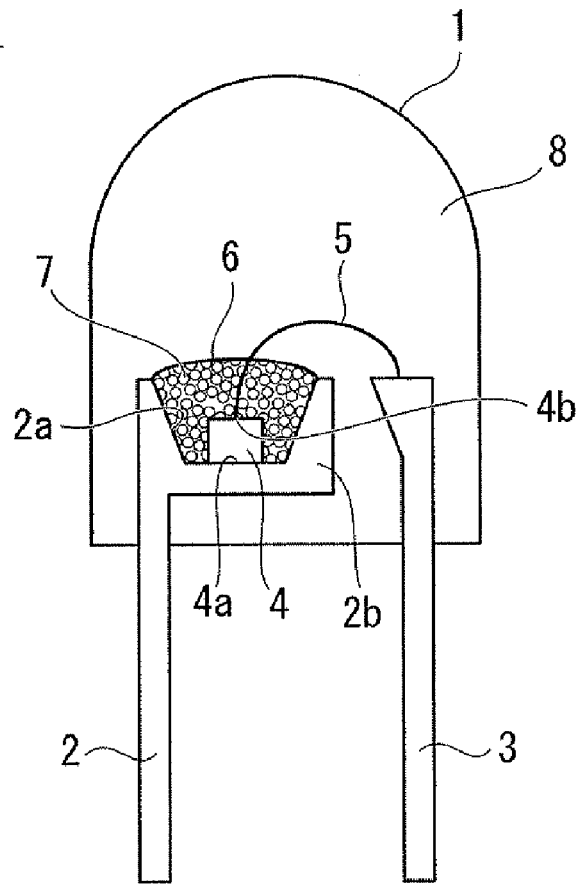
FIG. 1 is a cross-sectional view of a light-emitting device (i.e., a LED lighting device) of a first embodiment according to the invention.

| | |
|---|---|
| 1: | round-type LED lamp (i.e., light-emitting device: LED device) |
| 2: | first lead wire (i.e., lead frame) |
| 3: | second lead wire (i.e., lead frame) |
| 4: | light emitting diode device (i.e., LED chip) |
| 4a, 4b: | electrodes |
| 5: | bonding wire (i.e., fine gold wire) |
| 6: | first resin (i.e., sealing resin) |
| 7: | phosphor |
| 8: | second resin (i.e., sealing resin) |
| 11: | chip-type LED lamp for mounting a substrate |

-continued

| | |
|---|---|
| | (i.e., light-emitting device: LED device) |
| 12: | first lead wire (i.e., lead frame) |
| 13: | second lead wire (i.e., lead frame) |
| 15: | bonding wire (i.e., fine gold wire) |
| 16: | first resin (i.e., sealing resin) |
| 17: | phosphor |
| 18: | second resin (i.e., sealing resin) |
| 19: | substrate (i.e., alumina ceramic substrate or resin-molded substrate) |
| 20: | side surface member (i.e., wall surface member) |
| 20a: | recess |
| 20b: | sloped surface (i.e., reflective surface) |
| 23: | phosphor |
| 24: | light emitting diode device (i.e., LED chip) |
| 24a, 24b: | electrode |
| 111, 112, 113: | chip-type LED lamps for mounting substrates (i.e., light-emitting devices: LED devices) |

BEST MODE FOR CARRYING OUT THE INVENTION

Hereinafter, embodiments for implementing the invention will be described.

<First Embodiment: Phosphor>

A phosphor according to an embodiment of the invention includes a phosphor material having a composition represented by a general formula: $M(0)_a M(1)_b M(2)_{x-(vm+n)} M(3)_{(vm+n)-y} O_n N_{z-n}$, wherein $M(0)$ is one or more elements selected from Li, Na, Be, Mg, Ca, Sr, Ba, Sc, Y, La, Gd and Lu; $M(1)$ is one or more activators selected from Mn, Ce, Pr, Nd, Sm, Eu, Tb, Dy, Ho, Er, Tm and Yb; $M(2)$ is one or more elements selected from Si, Ge, Sn, Ti, Hf and Zr; $M(3)$ is one or more elements selected from Be, B, Al, Ga, In, Ti and Zn; O is oxygen; N is nitrogen; and the atomic ratio of $M(0)$, $M(1)$, $M(2)$, $M(3)$, O and N is adjusted to satisfy the following: x, y and z satisfy $33 \leq x \leq 51$, $8 \leq y \leq 12$ and $36 \leq z \leq 56$; a and b satisfy $3 \leq a+b \leq 7$ and $0.001 \leq b \leq 1.2$; m and n satisfy $0.8 \cdot me \leq m \leq 1.2 \cdot me$ and $0 \leq n \leq 7$ in which $me=a+b$; and v satisfies $v=\{a \cdot v(0)+b \cdot v(1)\}/(a+b)$ (wherein $v(0)$ is a valence of $M(0)$ ion and $v(1)$ is a valence of $M(1)$ ion).

With this configuration, sufficiently high light emitting intensity is provided. If the values of a, b, x, y, z, m and n depart from the ranges described above, the light emitting intensity decreases, which is not preferable.

In the phosphor according to an embodiment of the invention, the amount of the phosphor material may be not less than 80% by volume and the remainder may be one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1) and $SrSi_6N_8$. Accordingly, sufficiently high light emitting intensity is provided. The remainder may be a crystal phase or an amorphous phase. If the content of the phosphor material is less than 80% by volume, a sufficiently high light emitting intensity cannot be provided.

In the phosphor according to an embodiment of the invention, the value of n is defined as $0 \leq n \leq 7$. It is preferred that the valence of the $M(0)$ element is $v(0)$, the valence of the $M(1)$ element is $v(1)$ and the inequality $0 \leq n \leq \{a \cdot v(0)+b \cdot v(1)\}/2$ is satisfied.

This is because if the value of n is smaller than $\{a \cdot v(0)+b \cdot v(1)\}/2$, the temperature characteristics are improved and the aspect ratio decreases which increases the dispersibility to the resin. If the value of n is smaller than $\{a \cdot v(0)+b \cdot v(1)\}/2$, the light emission wavelength shifts toward a longer wavelength.

If the value of n is larger than $\{a \cdot v(0)+b \cdot v(1)\}/2$, the amount of other crystal phase or amorphous phase of one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1) and $SrSi_6N_8$ increases and the light emitting intensity tends to decrease.

A preferred range of a+b is $3 \leq a+b \leq 7$.

If the value of a+b becomes smaller than 3, the amount of other crystal phase or amorphous phase of one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1) and $SrSi_6N_8$ increases and the light emitting intensity decreases which is not preferable.

If the value of a+b becomes larger than 7, the amount of other crystal phase or amorphous phase of one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1) and $SrSi_6N_8$ increases, light emitting intensity decreases and temperature characteristics also unfavorably decrease, which is not preferable.

A preferred range of the value of b is $0.001 \leq b \leq 1.2$. If the value of b is smaller than 0.001, the number of atoms which emit light is too small and thus sufficient light emitting intensity cannot be obtained. If the value of b exceeds 1.2, light emitting intensity decreases due to concentration quenching, which is not preferable. Neither of these ranges is preferable. A still more preferred range of the value of b is $0.01 \leq b \leq 0.9$, and with b in this range, a sufficiently high light emitting intensity can be provided. As the value of b is changed, the light emission spectrum of the phosphor varies from 490 to 530 nm.

$M(0)$ can be one or more elements selected from Li, Na, Be, Mg, Ca, Sr, Ba, Sc, Y, La, Gd and Lu. Among these, Ca, Sr and Ba are preferred from the viewpoint of sufficiently high light emitting intensity, and Sr is more preferred. If Sr is partially replaced by Ca, the light emission color shifts toward a longer wavelength. If Sr is partially replaced by Ba, the light emission color shifts to a shorter wavelength.

$M(1)$ can be one or more selected from Mn, Ce, Pr, Nd, Sm, Eu, Tb, Dy, Ho, Er, Tm and Yb. These elements are activators. An especially preferred $M(1)$ element is one or more selected from Ce, Eu and Yb. The phosphor of the present embodiment emits white blue light if $M(1)$ is Ce, emits blue-green light if $M(1)$ is Eu and emits green light if $M(1)$ is Yb.

<Average Particle Diameter>

The phosphor according to an embodiment of the invention is preferably powder having an average particle diameter of not less than 0.1 μm to not more than 50 μm.

If the average particle diameter is smaller than 0.1 μm, the influence of surface defects becomes significant and light emitting intensity thus decreases, which is not preferable. If the average particle diameter is larger than 50 μm, absorption of excitation light becomes insufficient and light emission decreases, which is not preferable. The particle size of the phosphor can be measured by a laser diffraction and scattering method.

<Average Aspect Ratio>

In the phosphor according to an embodiment of the invention, the average aspect ratio of the primary particles which constitute the phosphor powder is preferably not more than 20.

If the average aspect ratio is not more than 20, the dispersibility to resin is increased, excitation light is absorbed efficiently and light emitting intensity becomes sufficiently high.

If the average aspect ratio is larger than 20, kneading to form a resin is difficult and voids are easily formed in the interface of the resin and the phosphor particles. If the average aspect ratio is larger than 20, particles may become confounded and absorption of the excitation light by phosphor particles arranged parallel to the excitation light becomes insufficient. In this case, sufficiently high light emitting intensity cannot be obtained.

If the primary particles constituting the phosphor powder are plate-shaped, the aspect ratio is obtained from sectional shapes.

<Additional Trace Element>

The relationship between an additional trace element and light emitting property in the phosphor according to an embodiment of the invention was examined. It was observed that more excellent light emitting property was obtained if the phosphor includes 5 to 300 ppm of fluorine or 10 to 3000 ppm of boron.

This phenomenon is significant if not less than 5 ppm of fluorine and not less than 10 ppm of boron is included. No additional effect can be obtained if not less than 300 ppm of fluorine and not less than 3000 ppm of boron is included.

<Oxygen Content>

The light emitting property is further improved if the oxygen content in the phosphor according to an embodiment of the invention is larger than that calculated on the basis of the general formula by an amount of not more than 0.4% by mass.

An amount of oxygen larger than that calculated on the basis of the general formula by an amount of not more than 0.4% constitutes a transparent film formed at least partially on the surfaces of the powder particles of the phosphor. The transparent film provides improved oxidation resistance of the powder particles of the phosphor and reduced difference in refractive index between the powder particles and the sealing resin. Light loss in an interface of the phosphor and the sealing resin is thus reduced. The number of unpaired electrons and defects on the particle surfaces of the phosphor are reduced. These configurations are effective in increasing the light emitting intensity.

<Transparent Film>

A transparent film may be formed at least partially on the surfaces of the powder particles of the phosphor according to an embodiment of the invention. The thickness of the transparent film is (10 to 180)/$n_k$ (nanometers). $n_k$ represents a refractive index of the transparent film and is 1.2 to 2.5, more preferably, not less than 1.5 to not more than 2.0.

If the thickness of the transparent film is larger than the above range, the transparent film itself absorbs light and thus the light emitting intensity decreases, which is not preferable. If the thickness of the transparent film is smaller than the above range, it is difficult to form a uniform transparent film and thus an effect of reducing light loss in an interface of the phosphor and the sealing resin becomes insufficient, which is not preferable.

Generally, a suitable thickness of the transparent film is provided by the refractive index $n_k$ of the transparent film. If the transparent film has a high refractive index, light loss can be reduced even if the thickness is small. If the refractive index is low, it is necessary to increase the thickness of the transparent film in order to achieve the object.

Examples of a material suitable for the transparent film include inorganic materials, such as silica, alumina, titania, magnesia and magnesium fluoride; and resin, such as polystyrene, polycarbonate and polymethylstyrene.

<Dispersibility>

The surfaces of the powder particles of the phosphor according to an embodiment of the invention may be coupling-treated. The coupling-treatment improves the dispersibility of the phosphor in resin and the adhesiveness of the resin and the phosphor.

Examples of the coupling agent include a silane coupling agent, a titanate-based coupling agent and an aluminate-based coupling agent. The coupling treatment may be performed after the transparent film is formed as needed.

<Conductive Inorganic Material>

If the phosphor according to an embodiment of the invention is excited by an electron ray, a conductive inorganic material may be mixed into the phosphor to impart conductivity to the phosphor.

Examples of the conductive inorganic material include oxide, oxynitride, nitrides or a mixture thereof which includes one or more elements selected from Zn, Al, Ga, In and Sn.

<Inorganic Phosphor and Fluorescent Dye>

If necessary, an inorganic phosphor or a fluorescent dye, which emits color different from the light emission color of the phosphor material used in the phosphor according to an embodiment of the invention, may be mixable into the phosphor according to an embodiment of the invention.

The thus-obtained phosphor according to an embodiment of the invention has a wider excitation range of an electron ray, an X-ray and ultraviolet to visible light as compared with a normal oxide phosphor. Especially when Eu is used as an activator, the phosphor emits 480 to 540-nm green-blue to green light.

The phosphor according to an embodiment of the invention having the property described above is suitable for light-emitting devices, such as a lighting device, a display device, an image display device, a pigment and an ultraviolet ray absorbent. In addition, the phosphor is excellent in heat resistance and long-time stability in an oxidizing atmosphere and in a damp environment.

Although a method for producing the phosphor according to an embodiment of the invention is not especially provided, the following method can provide a phosphor with high brightness.

<Method for Producing Phosphor>

The method for producing a phosphor according to an embodiment of the invention includes a step (i.e., a kneading step) of kneading a raw material to produce a raw material mixture, a step (i.e., a sintering step) of sintering the raw material mixture, a step (i.e., a first grinding and classifying step) of grinding and classifying the mass of the sintered raw material mixture, a step (i.e., a heat treatment step) of heat-treating the sintered raw material mixture and a step (i.e., a second grinding and classifying step) of grinding and classifying the mass of the heat-treated material.

The first and second grinding and classifying steps may be omitted.

<Kneading Step>

The raw material may include M(1) metal, silicide, oxide, carbonate, nitride, oxynitride, chloride, fluoride, acid fluoride, hydroxide, oxalate, sulfate, nitrate, an organic metallic compound, or a compound or a double compound which forms oxide, nitride and oxynitride when heated.

The raw material may also include M(0) metal, silicide, oxide, carbonate, nitride, oxynitride, chloride, fluoride, acid fluoride, hydroxide, oxalate, sulfate, nitrate, organic metallic compound, or a compound or a double compound which forms oxide, nitride and oxynitride when heated.

The raw material may also include M(2) or M(3) metal, silicide, oxide, carbonate, nitride, oxynitride, chloride, fluoride, acid fluoride, hydroxide, oxalate, sulfate, nitrate, organic metallic compound, or a compound or a double compound which forms oxide, nitride and oxynitride when heated.

Among these, oxide and nitride are preferred as a raw material of M1; oxide, carbonate, nitride and silicide are preferred as a raw material of M(0); and nitride, oxide and silicide are preferred as a raw material of M(2) or M(3).

When a phosphor including Eu as an activator is produced using a trivalent europium raw material as a starting material, europium nitride or europium oxide which is a trivalent europium raw material is preferably used as the starting material of the raw material mixture.

Europium oxide is reduced to a divalent element in the sintering step. Generally, a nitride raw material includes oxygen as a normal impurity. Oxygen included in this oxygen or europium oxide is an impurity of the phosphor or a component element of other crystal phases.

When the raw material mixture is sintered under coexistence of carbon or a carbon-including compound, europium oxide is reduced strongly and the amount of oxygen decreases.

Bivalent europium emits light preferably. Accordingly, if a compound including trivalent europium is used as a raw material, it is necessary to reduce the compound in the sintering step.

Regarding the ratio of bivalent europium to trivalent europium in the total europium content in the phosphor according to an embodiment of the invention, the larger the bivalent europium the better. The bivalent europium content in the total europium is preferably not less than 50% and more preferably not less than 80%. The trivalent europium, which emits light at a different wavelength from that of the bivalent europium, causes variation in the color of emitted light, which is not preferable.

The ratio of the bivalent europium to the trivalent europium can be analyzed by an X-ray absorption fine structure (XAFS) analysis method.

If necessary, a phosphor powder according to an embodiment of the invention may be produced in advance and added and mixed to a raw material mixture as a seed. When the seed is added, a synthetic reaction is promoted to enable preparation at a low temperature. A phosphor with a higher crystallinity is obtained and the light emitting intensity of the phosphor is increased. A preferred amount of the seed to be added is 1 to 50 parts by mass with respect to 100 parts by mass of the phosphor raw material.

At least one or more M-containing materials selected from $MSi_2$, $MSiN_2$, $M_2Si_5N_8$, $M_3Al_2N_4$ and $MSi_6N_8$, may be employed as a starting material (M is one or more divalent elements selected from M(0) and M(1)). The starting material may also include a Li-containing compound such as $LiSi_2N_3$.

When preparing a phosphor of a composition including M or Li and having a value of n smaller than $\{a \cdot v(0) + b \cdot v(1)\}/2$, it is necessary to employ, for example, nitride of M or Li as a raw material. Since these nitrides are easily oxidized in ambient air, it is necessary to perform weighing and mixing of the nitrides in an air-shutoff glove box. The raw material mixture is usually exposed to air until the sintering furnace is filled with the raw material mixture and the furnace is purged of air. Accordingly, even if the raw material mixture is weighed or mixed in a glove box, certain oxidization of the raw material mixture is inevitable.

Since such compounds as $MSiN_2$, $M_2Si_5N_8$, $M_3Al_2N_4$, $MSi_6N_8$ and $LiSi_2N_3$ are stable in ambient air and thus are not oxidized during weighing and mixing, or in the time before the raw material mixture is filled in a sintering furnace and the furnace is purged of air.

The powder of the raw material described above may also be mixed in a dry mill without using a solvent. Generally, however, the powder is mixed in a wet mill with a solvent. When the powder is mixed in a wet mill using a solvent, a microscopically uniform powder mixture can be obtained in a short time.

Examples of the mill include a ball mill, a vibration mill and an attrition mill. Among these, a ball mill is suitably used from the viewpoint of equipment cost.

Examples of the solvent used in the mixing include ethanol, methanol, isopropanol, hexane, acetone and water. Among these, ethanol and hexane are suitably used from the viewpoint of safety and antioxidation of the raw material powder.

The ratio of the raw material powder to the mixed solvent defines the viscosity of a mixed slurry. The preferred viscosity of the mixed slurry is about 50 to 500 cps. If the viscosity of the mixed slurry is smaller than 50 cps, a large amount of energy is necessary for drying the mixed slurry, which is not preferable. If the viscosity of the mixed slurry exceeds 500 cps, a long time is required to obtain a uniform powder mixture, which is not preferable.

<Granulating Step>

A granulating step may be included in which the grain size of an aggregate of the raw material powder is adjusted by spray drying the raw material mixture. The granulating step imparts greater flowability and handling property to the aggregate of the raw material powder.

The raw material powder is mixed with a solvent in a wet mill to provide a mixed slurry. The powder is then dried to provide a powder mixture. The obtained mixed slurry may be left in, for example, a drier to make the solvent evaporate. However, a spray drier may be used to provide a powder mixture from which the solvent is removed in a short time without a concern for reisolation of the raw material powder. The powder mixture obtained using a spray drier has a particle size of tens to hundreds of μm and thus has greater flowability and handling properties.

The powder mixture is formed into a compact having a bulk density of not more than 40% through pressurization molding if necessary. Since the raw material powder is formed as a compact, scattering of the powder due to vacuum deairing in, for example, the sintering step can be prevented.

<Sintering Step>

A raw material mixture is placed in a sintering vessel and is sintered in a nitrogen atmosphere at a pressure of not less than 0.1 MPa to not more than 100 MPa.

If the nitrogen atmosphere pressure is smaller than 0.1 MPa, volatilization of the raw material mixture becomes significant, and disorder in composition occurs, thereby decreasing the light emitting intensity. If, on the other hand, the nitrogen atmosphere pressure is larger than 100 MPa, no additional effect is obtained in preventing volatilization of the raw material mixture, which is uneconomical and thus is not preferable.

The sintering temperature is from not lower than 1500° C. to not higher than 2200° C. If the sintering temperature is lower than 1500° C., a long time is required to obtain a phosphor in accordance with the embodiment of the invention, which is not preferable. If the sintering temperature is higher than 2200° C., the raw material fuses, which is also not preferable.

Since the sintering temperature is high and the sintering atmosphere is a nitrogen-containing inert atmosphere, a furnace of a metal resistance heating system or a graphite resistance heating system is preferably used as the furnace for the sintering. An electric furnace in which carbon is used is especially suitable for a high-temperature part of the furnace. In order to sinter the raw material while keeping bulk density low, a preferred sintering method includes a normal pressure sintering process and a gas pressure sintering process in which no mechanical pressurization is applied from outside.

When sintered under coexistence of carbon or a carbon-including compound, the raw material mixture touches a reducing atmosphere. Accordingly, if a raw material compound with an especially high oxygen content is used, a phosphor including a high brightness phosphor can preferably be obtained.

The carbon or the carbon-including compound used herein may be an amorphous carbon, graphite or silicon carbide and is not particularly limited. Among these, amorphous carbon and graphite are preferably employed. Examples of the amorphous carbon and graphite include carbon black, graphite powder, activated carbon, and silicon carbide powder, molded and sintered product thereof. These materials produce similar effects.

Aspects of coexistence are as follows: powdered carbon may be contained in the raw material mixture; a sintering vessel consisting of carbon or a carbon-including compound may be employed; carbon or a carbon-including compound may be disposed inside or outside of the sintering vessel consisting of a material other than carbon or a carbon-including compound; and a heating element and a heat-insulating element consisting of carbon or a carbon-including compound may be employed. A similar effect can be obtained in any manner described above.

A powder mixture of the above-described raw material mixture is preferably sintered in a state in which a filling factor is kept to not more than 40% in bulk density.

This is because, if the raw material powder to be sintered has a free space surrounding the same, crystals hardly touch each other since reaction products make crystal grow into the free space. In this manner, crystals with few surface defects can be produced.

Bulk density is the volume filling factor of the powder and is obtained by dividing the ratio of massmass of the powder filled in a sintering vessel to volume by the theoretical density of a metallic compound.

Examples of the material of the sintering vessel include alumina, calcia, magnesia, graphite and boron nitride. Among these, boron nitride is particularly preferable due to its low reactivity with the metallic compound.

Preferably, the filling amount of the raw material mixture is not less than 20% by volume as the ratio of the bulk volume of the raw material mixture to the volume of the sintering vessel in a state in which the filling factor of not more than 40% in bulk density is kept.

When the raw material mixture is sintered with the filling amount being not less than 20% by volume of the sintering vessel, volatilization of volatile components included in the raw material mixture is controlled and therefore disorder in composition in the sintering step is controlled. The filling amount of the raw material mixture in the sintering vessel is increased, an economic effect can be provided.

<First Grinding and Classifying Step>

A mass of the sintered raw material mixture, i.e., a sintered mass including the phosphor according to an embodiment of the invention, is ground in a grinder (i.e., grinding device) usually used in factories. The grinder consists of ball mill and a jet mill made from a grinding medium or a lining material of an alumina sintered product, a zirconium oxide sintered product, a silicon nitride sintered product or an α-sialon sintered product.

The mass of the sintered raw material is ground until the average particle diameter thereof becomes as small as not more than 50 µm. An average particle diameter exceeding 50 µm impairs the flowability of the powder and its dispersibility into a resin. As a result, the light emitting intensity becomes uneven partially when the powder is combined with a light-emitting device to provide a light-emitting device. It is therefore preferred to grind the mass until the average particle diameter is not more than 20 µm.

The lower limit of the average particle diameter is not particular limited. It generally takes a long time, however, to grind the mass of the sintered raw material until the particle size becomes not more than 0.5 µm. Such a particle size often causes defects on the surface of the phosphor powder. As a result, light emitting intensity may be decreased.

The grinding medium or the lining material is made of a alumina sintered product, a zirconium oxide sintered product, a silicon nitride sintered product, or an α-sialon sintered product. This is because the ingression of impurities during the grinding step can be controlled and light emitting intensity is not largely decreased even if ingression of impurities occurs.

When the raw material mixture is ground using a grinder consisting of a grinding medium or a lining material including iron and an iron group element, the phosphor becomes blackened and iron and the iron group element may be incorporated into the phosphor in a heat treatment step described later. As a result, light emitting intensity decreases significantly, which is not preferable.

The phosphor powder obtained in the grinding step is classified as being able to provide a desired particle size distribution.

Examples of the classification method include screening, air classification, precipitation in a solution, and classification in a selection pipe. Preferably, a ground product of the mass of raw material mixture is classified by elutriation.

The classification may be performed after a surface treatment.

<Heat Treatment Step>

The sintered phosphor powder, the ground phosphor powder or the phosphor powder whose particle size has been adjusted through classification is heat-treated at a temperature of not less than 600° C. to not more than 2200° C. in one or more atmospheres selected from nitrogen, ammonia and hydrogen, if necessary. The heat treatment can reduce the number of defects introduced in the grinding step and recover light emitting intensity.

If the heat treatment temperature is lower than 600° C., the effect of removing the defects of phosphor becomes small and it takes long time to recover light emitting intensity, which is not preferable.

If, on the other hand, the heat treatment temperature is higher than 2200° C., the phosphor powder partially fuses or particles sticks together again, which is not preferable.

The heat treatment is preferably performed in one or more atmospheres selected from nitrogen, ammonia and hydrogen. If the phosphor powder is heat-treated in these atmospheres, the phosphor powder is not oxidized and defects can be removed.

The atmospheric pressure is preferably from not less than 0.1 MPa to not more than 100 MPa as in the sintering step. If the atmosphere pressure is less than 0.1 MPa, the phosphor component element partially evaporates at a certain heat treatment temperature and light emitting intensity decreases, which is not preferable. If, on the other hand, the nitrogen atmosphere pressure is more than 100 MPa, no additional effect to control evaporation of the raw material mixture is obtained. Such pressure is thus uneconomical and is not preferable.

The sintered product is washed using water or a solvent of an acid aqueous solution. The washed product has a smaller amount of a glass phase, a second phase, or an impurity phase, as well as higher brightness. In this case, acid can be selected from a monomer or a mixture of sulfuric acid, chloride, nitric acid, hydrofluoric acid and organic acid. Among these, a mixture of hydrofluoric acid and a sulfuric acid can be used to provide a greater effect of removing impurities.

<Second Grinding and Classifying Step>

If necessary, the mass of the sintered heat-treated material is ground in the same manner as in the first grinding and classifying step until the average particle diameter becomes not more than 20 μm using a grinder consisting of a grinding medium or a lining material of a alumina sintered product, a zirconium oxide sintered product, a silicon nitride sintered product, or an α-sialon sintered product.

<Transparent Film Forming Step>

If necessary, a transparent film is formed at least partially on a surface of the phosphor.

The method for forming the transparent film on the surface of the phosphor according to an embodiment of the invention includes, for example, the following steps. The phosphor powder is caused to be suspended in an organic solvent, such as alcohol using a stirrer or an ultrasonic dispersing device. An alkaline aqueous solution, such as an organic metal complex or a metal alkoxide, and an aqueous ammonia solution, are added dropwise to the suspension to form a coat of metal oxide or metal hydroxide on particle surfaces of the phosphor. Then, the phosphor particles are sintered in a non-oxidizing atmosphere, such as ambient air or nitrogen, if necessary. The thickness of the transparent film can be controlled in accordance with a dropping condition, a stirring condition and a suspending condition.

The phosphor powder may be suspended in water (i.e., a pH-controlled acid, alkali or buffer solution) using a stirrer or an ultrasonic dispersing device. A metallic salt aqueous solution may be added dropwise while keeping pH constant. A coat of metallic oxide or hydroxide may be formed on the particle surfaces of the phosphor. The particles may then be screened, washed and dried. If necessary, the particles may be sintered in a non-oxidizing atmosphere, such as ambient air or nitrogen. The thickness of the transparent film may be controlled in accordance with a dropping condition, a stirring condition or a suspending condition of the metallic salt aqueous solution.

<Impurities>

In order to obtain a phosphor with high light emission brightness, the smallest amount of impurities possible is the most preferred. Since light emission is prevented if impurities, such as Fe, Co and Ni, are included in large amounts, it is preferred to select the raw material powder and to control the synthesizing step so that the total amount of these elements is not more than 500 ppm.

In the method for producing the phosphor according to an embodiment of the invention, a raw material mixture which can constitute the phosphor according to an embodiment of the invention is sintered in a nitrogen atmosphere at a pressure of from not less than 0.1 MPa to not more than 100 MPa at a temperature of from not less than 1500° C. to not more than 2200° C. In this manner, a phosphor with a high light emitting intensity can be provided.

<Light-Emitting Device>

The light-emitting device according to an embodiment of the invention is formed at least by a light emission source and the phosphor according to an embodiment of the invention. Examples of lighting devices using the light-emitting device include a LED lighting device, an EL lighting device and a fluorescent lamp.

The LED lighting device can be fabricated by well-known methods disclosed, for example, in Japanese Unexamined Patent Application, First Publication Nos. H5-152609 and H7-99345, using the phosphor according to an embodiment of the invention.

"First Embodiment"

As a first embodiment of the light-emitting device according to the invention, a round-type white light emitting diode lamp (i.e., a LED lighting device or a LED device) will be described.

FIG. 1 is a cross-sectional view of a round-type white light emitting diode lamp 1 which is the first embodiment of the light-emitting device according to the invention.

As illustrated in FIG. 1, the round-type white light emitting diode lamp 1 includes a first lead wire 2 and a second lead wire 3. The first lead wire 2 includes a recess 2a, in which a light emitting diode device (i.e., a LED chip) 4 is placed. A lower electrode 4a of the light emitting diode device 4 is electrically connected to a bottom surface of the recess 2a with conductive paste. An upper electrode 4b of the light emitting diode device 4 is electrically connected to a second lead wire 3 by a bonding wire (i.e., a fine gold wire) 5.

A first resin (i.e., sealing resin) 6 is a transparent resin in which a phosphor 7 is dispersed. The first resin 6 covers the entire light emitting diode device 4. A distal end 2b of the first lead wire 2 including the recess 2a in which the phosphor 7 is dispersed, the light emitting diode device 4 and the first resin 6 in which the phosphor 7 is dispersed are sealed with a transparent second resin (i.e., another sealing resin) 8.

The transparent second resin 8 is substantially column shaped including a convex lens-shaped tip section. The diode lamp is thus called a round-type diode lamp. The first resin 6 and the transparent second resin 8 are preferably made of silicone resin. Other resins, such as polycarbonate resin and epoxy resin, and transparent materials, such as glass, may also be employed. Resin materials which hardly deteriorate when exposed to ultraviolet light are preferably employed.

The first resin 6 and the transparent second resin 8 may be made of the same or different resin materials. It is preferred, however, to employ the same resin material from the viewpoint of ease of fabrication and adhesiveness.

If a transparent film in formed at least partially on the surfaces of the particles of the phosphor 7, the refractive index of the first resin 6 in which the phosphor 7 is dispersed and the refractive index of the transparent film preferably approximate each other. Thus, reflection in an interface of the transparent film and the first resin 6 can be prevented.

In this case, a light-emitting device having still higher brightness can be provided by disposing a resin (i.e., the transparent second resin) with a refractive index lower than that of the first resin 6 in an outside of the first resin 6 in which the that phosphor 7 is dispersed.

The phosphor 7 dispersed in the first resin 6 is excited by light emitted from the light emitting diode device (i.e., the LED chip) 4. Accordingly, light emitting intensity can be increased. Light of various colors can be emitted. If white light is emitted, a higher color rendering index can be obtained.

"Second Embodiment"

As a second embodiment of the light-emitting device according to the invention, a chip-type white light emitting diode lamp (i.e., a LED lighting device or a LED device) will be described.

Figure 2:
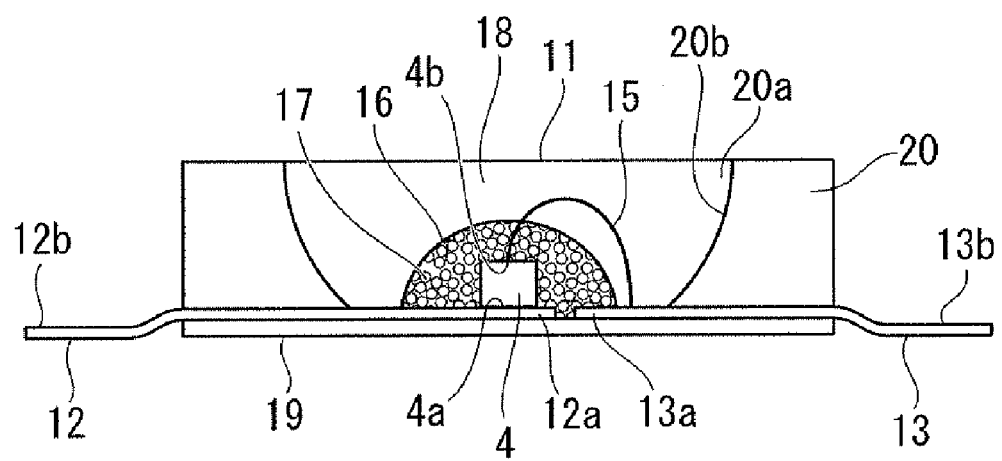
FIG. 2 is a cross-sectional view of a light-emitting device (i.e., a LED lighting device) of a second embodiment according to the invention.

FIG. 2 is a cross-sectional view of a chip-type white light emitting diode lamp 11 which is the second embodiment of the light-emitting device according to the invention.

As illustrated in FIG. 2, in the chip-type white light emitting diode lamp 11, a first lead wire 12 and a second lead wire 13 are fixed to a ceramic substrate 19, which is made of alumina ceramic having a high light reflectance. A first end 12a of the first lead wire 12 and a first end 13a of the second lead wire 13 are positioned at a substantially central portion of the substrate 19. A second end 12b of the first lead wire 12 and a second end 13b of the second lead wire 13 are drawn out of the substrate 19 to form electrodes to be soldered when the substrate 19 is mounted on an electric substrate. A light emitting diode device (i.e., a LED chip) 4 is placed on and fixed to the first end 12a of the first lead wire 12 at a central portion of the substrate. A lower electrode 4a of the light emitting diode device 4 is electrically connected to a first lead wire 12 with conductive paste. An upper electrode 4b of the light emitting diode device 4 is electrically connected to a second lead wire 13 by a bonding wire (i.e., a fine gold wire) 15.

A first resin (i.e., sealing resin) 16 is transparent resin in which a phosphor 17 is dispersed. The first resin 6 covers the entire light emitting diode device 4. A wall surface member 20 having a bowl-shaped recess 20a formed at a central portion thereof is fixed to the ceramic substrate 19.

The recess 20a receives the light emitting diode device 4 and the first resin 16 in which the phosphor 17 is dispersed. The recess 20a includes a sloped surface 20b at a central portion thereof. The sloped surface 20b is a reflective surface for taking light in a forward direction. A curved surface of the sloped surface 20b is defined in consideration of a direction of light reflection. The sloped surface 20b which at least constitutes the reflective surface is a white or metallic luster surface having a high visible light reflectance.

The wall surface member 20 may be formed of, for example, a white silicone resin. The central recess 20a forms a recess as a final shape of the chip-type LED lamp. The recess 20a is filled with transparent second resin (i.e., another sealing resin) 18 so that the entire light emitting diode device 4 and the first resin 16 in which the phosphor 17 is dispersed are sealed.

The first resin 16 and the second resin 18 are preferably made of silicone resin. Other resins, such as a polycarbonate resin and an epoxy resin, and transparent materials, such as glass, may also be employed. Resin materials which hardly deteriorate when exposed to ultraviolet light are preferably employed.

The first resin 16 and the second resin 18 may be made of the same or different resin materials. It is preferred, however, to employ the same resin material from the viewpoint of ease of fabrication and adhesiveness.

The phosphor 17 dispersed in the first resin 16 is excited by light emitted from the light emitting diode device (i.e., the LED chip) 4. Accordingly, light emitting intensity can be increased. Light of various colors can be emitted. If white light is emitted, a higher color rendering index can be obtained.

"Third Embodiment"

As a second embodiment of the light emitting device according to the invention, a chip-type white light emitting diode lamp for mounting a substrate (i.e., a LED lighting device or a LED device) will be described.

Figure 3:
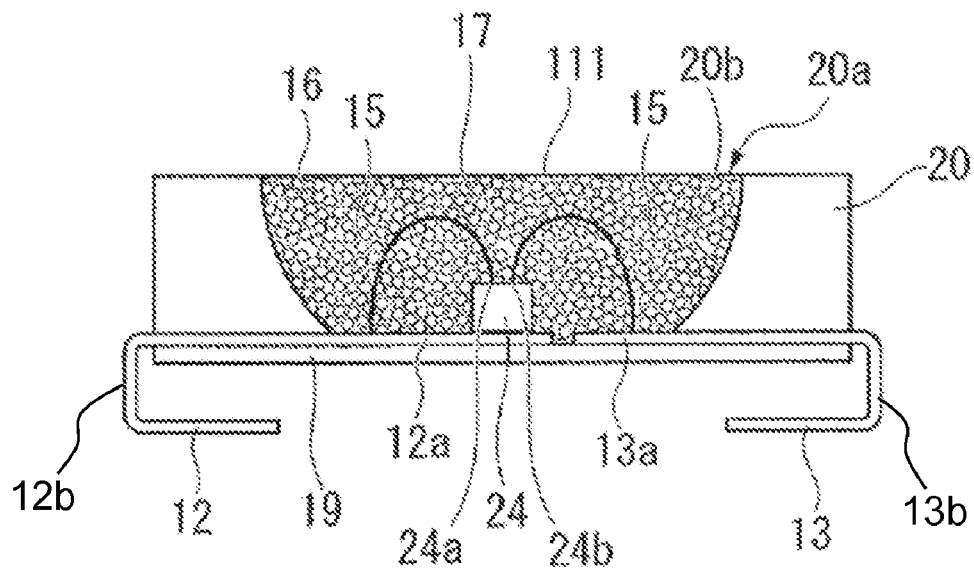
FIG. 3 is a cross-sectional view of a light-emitting device (i.e., a LED lighting device) of a third embodiment according to the invention.

FIG. 3 is a cross-sectional view of a chip-type white light emitting diode lamp 111 for mounting a substrate which is the third embodiment of the light-emitting device according to the invention.

As illustrated in FIG. 3, in the chip-type white light emitting diode lamp 111, a first lead wire 12 and a second lead wire 13 are fixed to a ceramic substrate 19, which is made of alumina ceramic having high light reflectance. A first end 12a of the first lead wire 12 and a first end 13a of the second lead wire 13 are positioned at a substantially central portion of the substrate 19. Another end 12b of the first lead wire 12 and another end 13b of the second lead wire 13 are drawn out of the substrate 19 to form electrodes to be soldered when the substrate 19 is mounted on an electric substrate. A light emitting diode device (i.e., a LED chip) 24 is placed on and fixed to the first end 12a of the first lead wire 12 at a central portion of the substrate.

A 350-µm sided blue LED chip is employed as the light emitting diode device 24. The blue LED chip is die-bonded onto the first lead wire (i.e., the lead) 12 with resin paste. Silver-plated copper lead frames is used as the lead wires (i.e., the leads) 12 and 13. A ceramic substrate molded with a nylon resin is used as the substrate 19.

The light emitting diode device 24 is a light-emitting device having two electrodes 24c and 24b formed on a surface thereof. A first electrode 24a and the first lead wire (i.e., the lead) 12 are electrically connected to each other by a bonding wire (i.e., a fine gold wire) 15. A second electrode 24b and the second lead wire (i.e., the lead) 13 are electrically connected to each other by a bonding wire (i.e., a fine gold wire) 15.

A wall surface member 20 is provided as in the second embodiment. A proper amount of the phosphor-containing first resin 16 is dropped so as to cover the light emitting diode device 24 and to fill the recess 20a of the wall surface member 20. The first resin 16 is then cured. In this manner, the chip-type white light emitting diode lamp (i.e., the LED lighting device) (i.e., the light-emitting device) is provided.

A light-emitting device package having a plurality of 350 µm×350 µm blue LED chips mounted thereon may be fabricated. It may be trimmed to provide individual light-emitting device packages, and the light emitting diode devices 24 may be selected from the individual device packages with respect to color tone and light emitting intensity.

The phosphor 17 dispersed in the first resin 16 is excited by light emitted from the light emitting diode device (i.e., the LED chip) 24. Accordingly, light emitting intensity can be increased. Light of various colors can be emitted. If white light is emitted, a higher color rendering index can be obtained.

"Fourth Embodiment"

As a fourth embodiment of the light emitting device according to the invention, a chip-type white light emitting diode lamp for mounting a substrate (i.e., a LED lighting device or a LED device) will be described.

Figure 4:
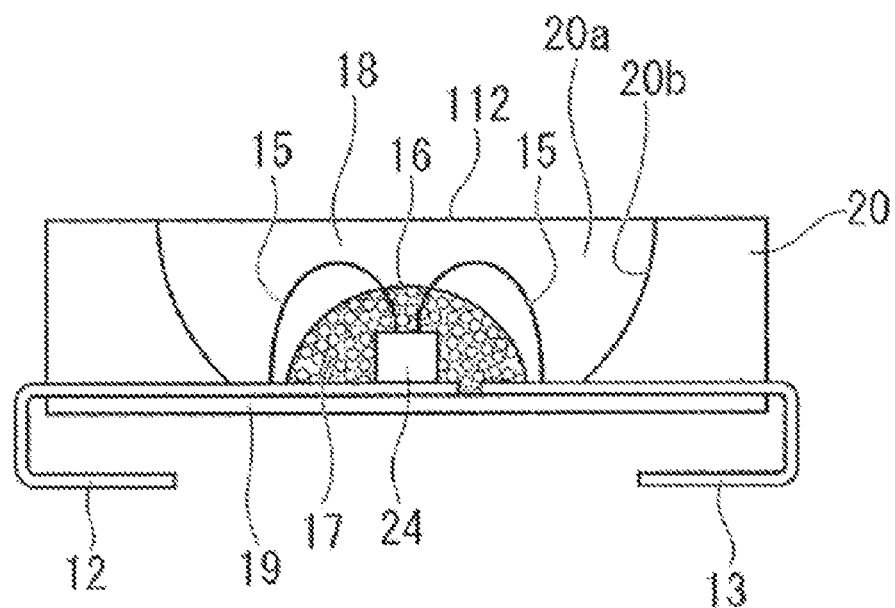
FIG. 4 is a cross-sectional view of a light-emitting device (i.e., a LED lighting device) of a fourth embodiment according to the invention.

FIG. 4 is a cross-sectional view of a chip-type white light emitting diode lamp 112 for mounting a substrate which is the fourth embodiment of the light-emitting device according to the invention.

As illustrated in FIG. 4, the chip-type white light emitting diode lamp 112 has the same configuration as that of the light-emitting device 111 according to the third embodiment, except that a second resin 18, in which no phosphor is dispersed, is provided. A light emitting diode device (i.e., a LED chip) 24 is disposed on and fixed to a central portion of the substrate. The same components are denoted by the same reference numerals.

The phosphor 17 dispersed in the first resin (i.e., sealing resin) 16 is excited by light emitted from the light emitting diode device (i.e., the LED chip) 24. Accordingly, light emitting intensity can be increased. Light of various colors can be emitted. If white light is emitted, a higher color rendering index can be obtained.

"Fifth Embodiment"

As a fifth embodiment of the light emitting device according to the invention, a chip-type white light emitting diode lamp for mounting a substrate (i.e., a LED lighting device or a LED device) will be described.

Figure 5:
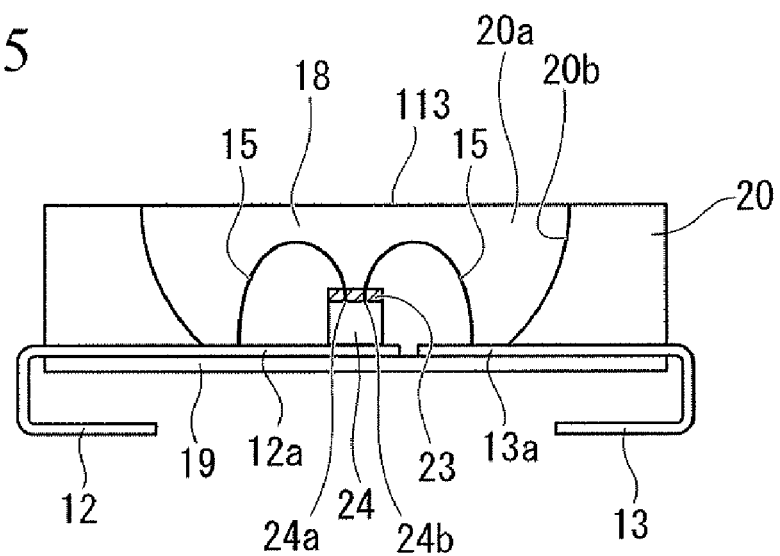
FIG. 5 is a cross-sectional view of a light-emitting device (i.e., a LED lighting device) of a fifth embodiment according to the invention.

FIG. 5 is a cross-sectional view of a chip-type white light emitting diode lamp for mounting on a substrate which is the fifth embodiment of the light-emitting device according to the invention.

As illustrated in FIG. 5, the chip-type white LED lamp 113 for mounting on a substrate has the same configuration as that of the light-emitting device 111 according to the third embodiment except that the phosphor 23 is attached directly so as to cover a surface of the light emitting diode device (i.e., the LED chip) 24 and a second resin (i.e., another sealing resin) 18, in which no phosphor is dispersed, is formed to cover the light emitting diode device 24 and to fill the recess 20a of the wall surface member 20. The light emitting diode device (i.e., the LED chip) 24 is disposed on and fixed to a central portion of the substrate. The same components are denoted by the same reference numerals.

The phosphor 23 formed on a surface of the light emitting diode 24 is excited by light emitted from the light emitting diode device (i.e., the LED chip) 24. Accordingly, light emitting intensity can be increased. Light of various colors can be emitted. If white light is emitted, a higher color rendering index can be obtained.

Hereinafter, configurations and effects common to the light-emitting devices of the first to fifth embodiments will be described.

<Light Emission Source>

A light emission source (i.e., light emitting diode devices 4 and 24) preferably emits 330 to 470-nm light. A light-emitting device which emits a 330 to 420-nm ultraviolet (or purple) light or a 420 to 470-nm blue light is especially preferable.

<LED Chip>

The light-emitting devices 1, 11, 111, 112 and 113 according to the embodiments of the invention use LED chips as light emission sources. In this manner, the device can be made compact, power consumption can be suppressed, and the device can be fabricated at a low cost and in a large quantity.

Since the phosphor according to an embodiment of the invention is included in the LED chip, a blue light emitted from the LED, as an excitation high source, excites the phosphor to emit light at high light emitting intensity in a wavelength region in which light is normally emitted at an low light emitting intensity. As a result, the color rendering index of white light can be increased. An LED light-emitting device of the color-rendering index of not less than 70 is provided.

If the LED chip is used as a light emission source, a gallium nitride-based compound semiconductor is preferably used from the point of light emission efficiency.

The LED chip is provided by a nitride-based compound semiconductor formed on a substrate by MOCVD or HYPE. $In_\alpha Al_\beta Ga_{1-\alpha-\beta}N$ (in which $0 \leq \alpha$, $0 \leq \beta$ and $\alpha+\beta \leq 1$) is preferably employed as a light emitting layer. Regarding a structure of the semiconductor, a homostructure, a heterostructure or a double heterostructure having a MIS junction, a PIN junction and a p-n junction may be employed. Various light emission wavelengths can be in accordance with semiconductor layer materials and the mixed crystallinity thereof. The semiconductor may be formed as a single quantum well structure or a multiple quantum well structure as a semiconductor active layer formed in a thin film which produces a quantum effect.

The gallium nitride-based compound semiconductor used as the LED chip has a refractive index as high as 2.4 to 2.5.

Accordingly, if the gallium nitride-based compound semiconductor is used as the light emission source, it is necessary to employ a resin with a high refractive index. The phosphor-containing first resin is preferably a resin with a high refractive index also from the viewpoint described above. In order to increase the efficiency in taking light out of the light-emitting device, It is preferred that the second resin disposed outside the first resin have a refractive index lower than that of the first resin.

<EL Device>

If an EL device is used as a light emission source, any EL device can be employed as long as it emits light in a from 330 nm to 470-nm light emission spectrum. Accordingly, any of inorganic and organic EL devices may be employed.

If the EL device is an inorganic EL device, any of a thin film device, a distributed device, a direct current drive device, and an alternating current drive device may be employed. The phosphor which emits EL is not particularly limited but a sulfide-based phosphor is preferably used.

If the EL device described above is an organic EL device, any of stacked, doped, low-molecular, and polymer devices can be employed.

In the light-emitting devices 1, 11, 111, 112 and 113 according to the embodiments of the invention, the phosphor according to an embodiment of the invention may be used alone. However, a light-emitting device which emits a desired color may be provided when both the phosphor of an embodiment of the invention and another phosphor having other light emitting property are used.

An exemplary combination of the phosphors include a from 330 to 420-nm ultraviolet LED-light-emitting device, a blue phosphor which is excited by from 330 to 420-nm light to emit light with a light emission peak at a wavelength of not less than 420 nm to not more than 480 nm, a phosphor according to an embodiment of the invention controlled to emit green light and a red phosphor. As the blue phosphor, $BaMgAl_{10}O_{17}$:Eu can mention $CaAlSiN_3$:Eu as the red phosphor. In this configuration, when the phosphors are irradiated with an ultraviolet ray emitted from the LED, the phosphors emit blue, green and red light at the same time, which are mixed to provide white light. In this manner, a white light-emitting device is provided.

The light-emitting devices 1, 11, 111, 112 and 113 according to the embodiments of the invention can acquire an extremely high color rendering index when the following components are combined together: a from 330 to 420-nm ultraviolet LED-light-emitting device, a blue phosphor, such as $BaMgAl_{10}O_{17}$:Eu, a phosphor according to an embodiment of the invention controlled to emit blue-green light, a phosphor according to an embodiment of the invention controlled to emit green light or a green phosphor, such as β-sialon phosphor, a yellow phosphor, such as α-sialon and a red phosphor, such as $CaAlSiN_3$:Eu.

Each of the light-emitting devices 1, 11, 111, 112 and 113 according to the embodiments of the invention is formed by a from 420 to 470-nm light-emitting device and a phosphor. A white light-emitting device is formed by combining the phosphor according to an embodiment of the invention controlled to emit green light and a red phosphor, such as $CaAlSiN_3$:Eu.

The light-emitting devices 1, 11, 111, 112 and 113 according to the embodiments of the invention can acquire an extremely high color rendering index when the following components are combined together: a 420 to 470-nm blue LED device and a phosphor according to an embodiment of the invention controlled to emit blue-green light, a phosphor according to an embodiment of the invention controlled to emit green light or a β-sialon phosphor or a green phosphor, such as $Ca_3Sc_2Si_3O_{12}$:Ce, a yellow phosphor, such as α-sialon and YAG:Ce and a red phosphor, such as $CaAlSiN_3$:Eu.

Further, the light-emitting devices 1, 11, 111, 112 and 113 according to the embodiments of the invention may include, as components, a phosphor which can be excited also by ultraviolet light and an LED, as an excitation light source, having the maximum intensity of the light emission wavelength at 380 to 410 nm. Accordingly, a colored LED device which only detects, as a color, light emitted by a phosphor emits can be provided.

For example, it is possible to fabricate blue, blue-green and green LEDs. The phosphor according to an embodiment of the invention is hardly affected by influences of temperature as light emitting property. These colored LEDs which use light emitted from a phosphor are excellent since no shift of the wavelength is caused by current values, which is problematic especially in green LEDs.

<Configuration of Light-Emitting Device>

If an LED chip is used as a light source, the light-emitting devices 1, 11, 111, 112 and 113 according to the embodiments of the invention are usually round-type LED devices or surface mounting-type LED devices. Since the devices of these types are standardized and widely used, the devices can be easily put to industrial use.

A configuration of the light-emitting device may be a Chip On Board in which a LED chip is directly mounted on a wired substrate. In this case, the configuration can be customized for each use and it is therefore possible to use the device in applications in which the advantageous temperature characteristic of the present phosphor is exhibited.

<Resin Member>

In the light-emitting devices 1, 11, 111, 112 and 113 according to the embodiments of the invention, at least the substrate and/or the reflector section among resin members which constitute the LED device preferably include a resin or a ceramic member.

The resin member is preferable since it can be fabricated at low cost and in a large quantities. A resin with high heat resistance and high reflectance is preferable. Examples thereof include nylon resin. A thermosetting resin is also preferable since it can be fabricated at relatively low cost and in a large quantities. A ceramic member with extremely high heat resistance is also preferable.

<Sealing Resin>

In the light-emitting devices 1, 11, 111, 112 and 113 according to the embodiments of the invention, a phosphor may be dispersed in a sealing resin formed to surround the LED chip. A light-emitting device with this configuration can be fabricated easily.

Preferably, the sealing resin of the LED chip includes a silicone resin at least partially. The silicone resin, having resistance to short wavelength light, is suitably used to seal a short wavelength LED chip. Since the resin is flexible methyl silicone resin, rupture of the bonding wire can be prevented. On the other hand, stiff phenyl silicone resin may also be employed. With the stiff resin, ingression of humidity into the chip can be prevented and thus the chip can be suitably used in a severe environment having, for example, a high humidity.

<Phosphor Dispersion>

In the light-emitting devices 1, 11, 111, 112 and 113 according to the embodiments of the invention, the phosphor is preferably dispersed at high density near the LED chip. With the phosphor being disposed near the LED chip, excitation light can be efficiently introduced into the phosphor.

The phosphor according to an embodiment of the invention has little variation in characteristic due to temperature change when compared with other phosphors. Accordingly, variation in characteristic remains small even if the temperature of the phosphor is increased due to heat generated by the LED chip with the phosphor being disposed near the LED chip.

In order to dispose the phosphor near the LED chip, a neighborhood of the LED chip may be sealed with the phosphor-containing first resin (i.e., the sealing resin) and the second resin (i.e., another sealing resin) may seal an outer periphery of the first resin. This method is preferred due to its low cost. Preferably, the first resin includes a silicone resin having a high heat resistance.

Similarly, in order to dispose the phosphor near the LED chip, the phosphor may be attached directly to the LED chip. For example, the phosphor may be attached directly to cover at least one surface of the LED chip. The phosphor may be deposited to form a layer on at least one surface of the LED chip as a wafer by, for example, spin coating, vapor deposition, or sputtering. With these methods, the phosphor layer can be preferably controlled and formed uniformly. The thickness of the phosphor layer is controlled to be from 1 μm to 100 μm. In this manner, light can be taken out of the LED chip through the phosphor layer, which is advantageous in producing white light from mixed colors.

Since the phosphor incorporated in the light-emitting devices 1, 11, 111, 112 and 113 according to the embodiments of the invention have excellent temperature characteristics, the light-emitting devices are preferably used in an environment in which a large amount of heat is generated. Preferably, the LED device may be used with electric power of not less than 0.2 W for each package. Preferably, the LED chip may be used with electric power of not less than $1.5 \times 10^4$ W/m² for each package in plane area density. More preferably, the LED device may be used with electric power of not less than $5 \times 10^4$ W/m² for each package.

Generally, the LED device is used with large amounts of electric power when the LED chip included in the LED device has an area greater than 350 μm×350 μm, when plural LED chips are included, and when the LED chip is a flip chip.

The light-emitting devices 1, 11, 111, 112 and 113 according to the embodiments of the invention may also be excited by ultraviolet light. Accordingly, a white LED can be formed by mixing colors emitted from several phosphors. In this light-emitting device, the phosphor according to an embodiment of the invention can emit either or both of blue and green light. In this case, however, it is necessary to provide the light-emitting device with a phosphor which emits red light. The white color formed of three mixed colors has a high color rendering index.

The phosphor according to an embodiment of the invention may only emit green light and an LED may emit excitation light and blue light.

The light-emitting device may include one or more phosphors according to an embodiment of the invention with two or more different compositions. In this manner, a continuous light emission spectrum excellent in color rendering index is obtained.

A desired continuous spectrum can be obtained if the light-emitting device contains a group of phosphors with stepwise-varied compositions. Since the half width of the synthesized light emission spectrum is not less than 100 nm, a high color rendering index is obtained.

Hereinafter, the invention will be described in detail with reference to Examples.

The invention, however, is not limited to these Examples.

EXAMPLES

Examples 1 to 10

First, a method for producing the phosphors of Examples 1 to 10 will be described.

Silicon nitride powder ($Si_3N_4$), aluminum nitride powder (AlN), strontium nitride powder ($Sr_3N_2$), strontium oxide powder (SrO) and europium oxide powder ($Eu_2O_3$) each having an average particle diameter of 0.5 μm oxygen content of 0.93% by mass and an α type content of 92% were used as the raw material powder.

In the general formula: $M(0)_aM(1)_bM(2)_{x-(vm+n)}M(3)_{(vm+n)-y}O_nN_{z-n}$, the above-described raw material powder was weighed at a composition (i.e., mass ratio, the same hereinafter) shown in Table 2 so as to take the values of a, b, m, x, y, z and n shown in Table 1 and the raw material powder was mixed using an agate pestle and a mortar for 30 minutes. M(1) was Eu.

TABLE 1

|  | a | b | m | x | y | z | n |
|---|---|---|---|---|---|---|---|
| Example 1 | 5.820 | 0.180 | 6.000 | 42.000 | 10.000 | 46.000 | 6.000 |
| Example 2 | 4.820 | 0.180 | 5.000 | 42.000 | 10.000 | 46.000 | 5.000 |
| Example 3 | 3.820 | 0.180 | 4.000 | 42.000 | 10.000 | 46.000 | 4.000 |
| Example 4 | 6.820 | 0.180 | 7.000 | 42.000 | 10.000 | 46.000 | 7.000 |
| Example 5 | 5.820 | 0.180 | 6.000 | 42.000 | 10.000 | 46.000 | 5.000 |
| Example 6 | 5.820 | 0.180 | 6.000 | 42.000 | 10.000 | 46.000 | 4.600 |
| Example 7 | 5.820 | 0.180 | 6.000 | 42.000 | 10.000 | 46.000 | 4.300 |
| Example 8 | 5.820 | 0.180 | 6.000 | 42.000 | 10.000 | 46.000 | 2.000 |
| Example 9 | 5.820 | 0.180 | 6.000 | 42.000 | 10.000 | 46.000 | 1.000 |
| Example 10 | 5.820 | 0.180 | 6.000 | 42.000 | 10.000 | 46.000 | 0.180 |

The obtained powder mixture was placed in an aluminum mold to form a compact having a bulk density of 25%. The compact was filled in a boron nitride (hBN) crucible. The ratio of the compact volume to the crucible volume was about 80%. The powder was weighed, mixed and molded in a glove box which can keep a nitrogen atmosphere with a moisture content of not more than 1 ppm and an oxygen content of not more than 1 ppm.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, the powder was heated from room temperature to 1000° C. at a speed of 500° C./h, nitrogen with 99.999% by volume purity was introduced at 1000° C., the pressure was controlled to 0.9 MPa, the temperature was increased to 1900° C. at 600° C./h and the powder was kept for two hours at 1900° C.

After the sintering step, the obtained sintered product (i.e., a sintered mass) was subject to course grinding, grinding by hand in a mortar of a silicon nitride sintered product, and then screening using a 30-μm sieve to provide phosphor powder (Examples 1 to 10) having an average particle diameter of 11 μm.

Next, the light emission spectrum and the excitation spectrum of the phosphor powder (Examples 1 to 10) were measured using a fluorescence spectrophotometer.

Figure 6:
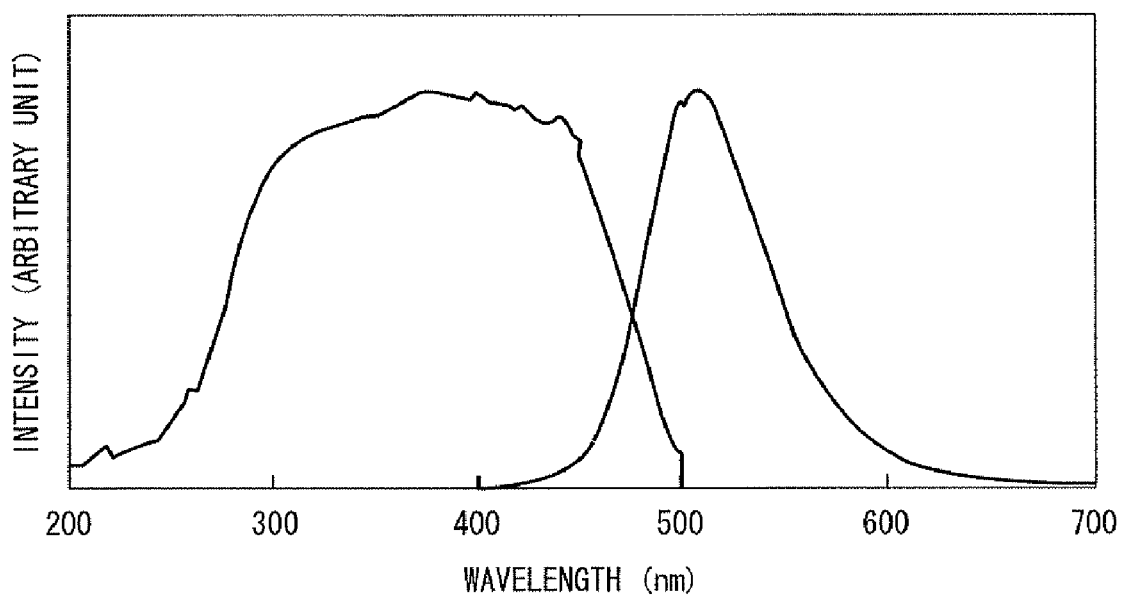
FIG. 6 illustrates light emission and an excitation spectrum of a phosphor of Example 1 according to the invention.

FIG. 6 illustrates measurement results of the light emission spectrum and the excitation spectrum of the phosphor of Example 1. As illustrated in FIG. 6, the peak wavelength of the excitation spectrum of the phosphor of Example 1 was 370 nm and the peak wavelength of the light emission spectrum excited with 450-nm blue light was 504 nm. The light emitting intensity of the peak wavelength was 100 counts.

Figure 7:
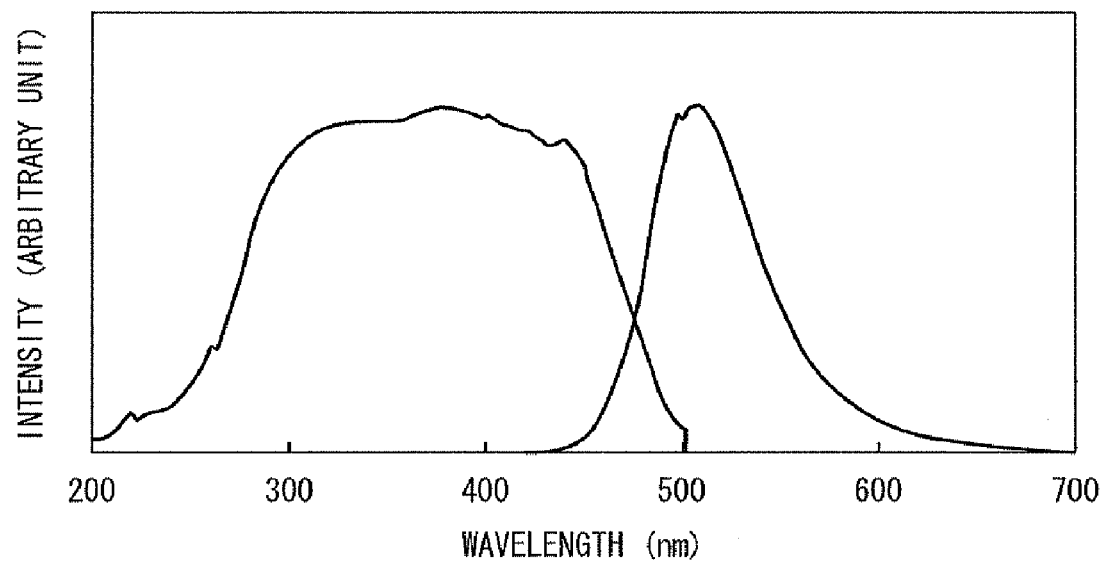
FIG. 7 illustrates light emission and an excitation spectrum of a phosphor of Example 7 according to the invention.

FIG. 7 illustrates measurement results of the light emission spectrum and the excitation spectrum of the phosphor of Example 7. As illustrated in FIG. 7, the peak wavelength of the excitation spectrum of the phosphor of Example 7 was 370 nm and the peak wavelength of the light emission spectrum excited with 450-nm blue light was 504 nm. The light emitting intensity of the peak wavelength was 103 counts.

The light emitting intensity and a light emission wavelength at the light emission peak of the phosphor powder (Examples 1 to 10) are shown in Table 2. The counted value of the light emitting intensity is based on an arbitrary unit value and is subject to measurement devices and conditions (the same hereinafter).

TABLE 2

|  | SrO(g) | $Sr_3N_2$(g) | $Si_3N_4$(g) | AlN(g) | $Eu_2O_3$(g) | light emitting intensity (count) | light emitting wavelength (nm) |
|---|---|---|---|---|---|---|---|
| Example 1 | 2.893 | 0 | 5.383 | 1.573 | 0.152 | 100 | 504 |
| Example 2 | 2.499 | 0 | 6.317 | 1.026 | 0.158 | 97 | 504 |
| Example 3 | 2.070 | 0 | 7.336 | 0.429 | 0.166 | 93 | 503 |
| Example 4 | 3.255 | 0 | 4.523 | 2.077 | 0.146 | 90 | 502 |
| Example 5 | 2.397 | 0.465 | 5.609 | 1.377 | 0.152 | 96 | 504 |
| Example 6 | 2.198 | 0.651 | 5.7 | 1.298 | 0.152 | 101 | 504 |
| Example 7 | 2.049 | 0.791 | 5.768 | 1.240 | 0.152 | 103 | 505 |
| Example 8 | 0.906 | 1.864 | 6.29 | 0.788 | 0.152 | 102 | 505 |
| Example 9 | 0.408 | 2.33 | 6.518 | 0.591 | 0.152 | 98 | 506 |
| Example 10 | 0 | 2.713 | 6.705 | 0.430 | 0.152 | 96 | 507 |

Figure 10:
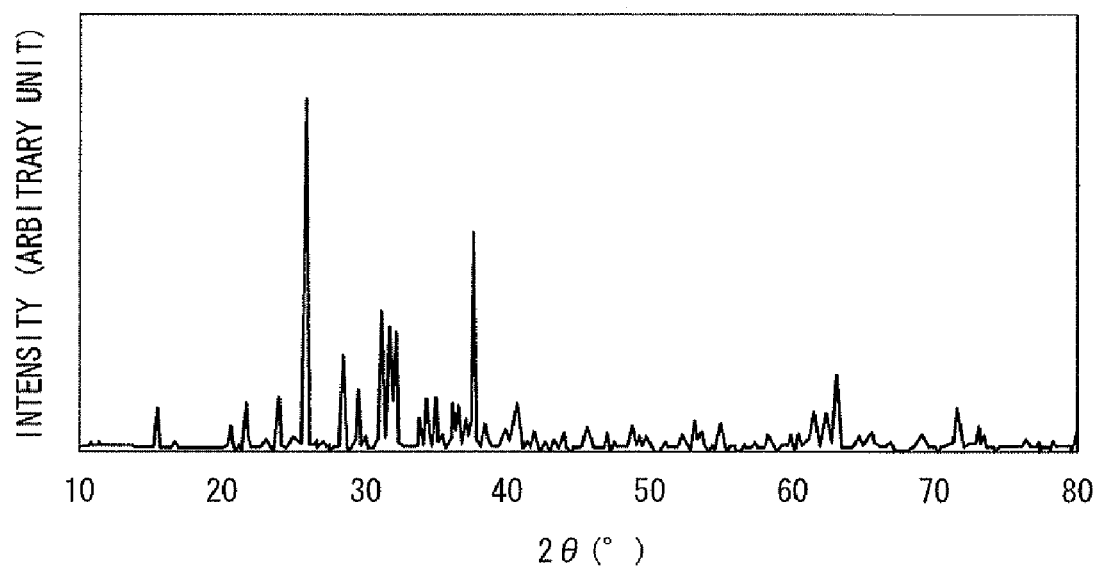
FIG. 10 is a powder X-ray diffraction chart of the phosphor of Example 1 according to the invention.

FIG. 10 illustrates a measurement result of a powder X-ray diffraction pattern of the phosphor of Example 1. A powder X-ray diffraction pattern consisting of a main diffraction peak was obtained as illustrated in FIG. 10.

Figure 11:
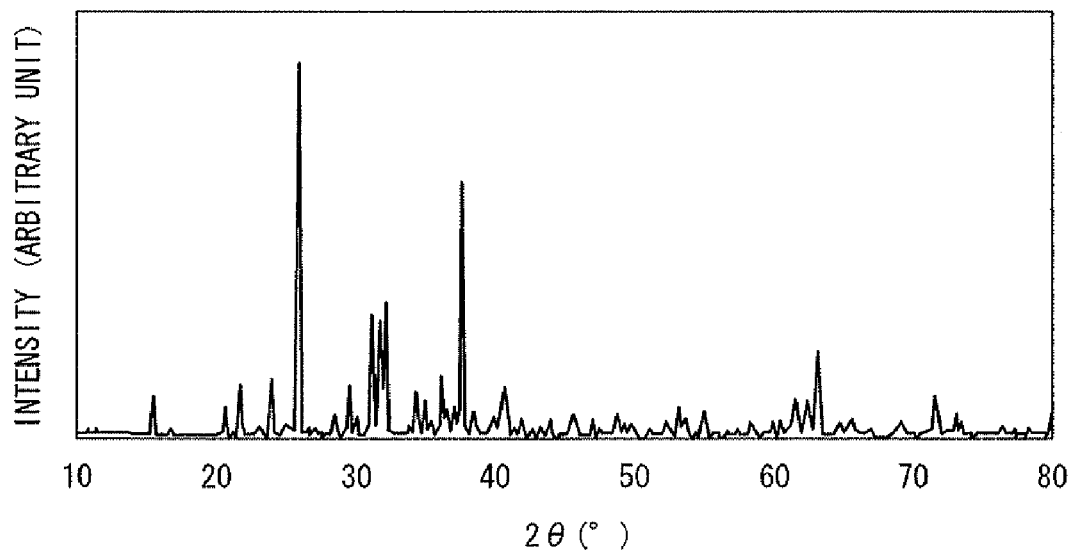
FIG. 11 is a powder X-ray diffraction chart of the phosphor of Example 7 according to the invention.

FIG. 11 illustrates a measurement result of a powder X-ray diffraction pattern of the phosphor of Example 7. A powder X-ray diffraction pattern consisting of a main diffraction peak was obtained as illustrated in FIG. 11.

Powder X-ray diffraction patterns consisting of a main diffraction peak were also obtained in the phosphors of Examples 2 to 6 and 8 to 10 as in Examples 1 and 7.

The phosphor powder (Examples 1 to 10) was exposed to an environment with a humidity of 80% and a temperature of 80° C. for 100 hours. Substantially no decrease in brightness was observed.

Next, the phosphor powder (Examples 1 to 10) was observed using an optical microscope while the phosphor powder was irradiated with a 365-nm ultraviolet ray as needed.

On the basis of color of the samples, the particle shape and the light emission color when irradiated with ultraviolet light, it was confirmed that the volume ratio of a non-light emitting phase consisting of one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$, or of a crystal phase which emits light different from blue-green light near 504 nm, was not more than 20%.

Single a crystal was grown for the phosphor of Example 1 and the crystal structure was analyzed. It was confirmed that the phosphor of Example 1 had a crystal structure shown in Tables 3 and 4. In Table 4, an M(0) element and an M(1) element are randomly placed in M(0, 1), an M(2) element and an M(3) element are randomly placed in M(2, 3) and an O element and an N element are randomly placed in M(O, N).

TABLE 3

| crystalline system | monoclinic system |
|---|---|
| space group | P 1 21 1 |
| lattice constant (a) | 14.6970(9) |
| lattice constant (b) | 9.036(2) |
| lattice constant (c) | 7.4677(7) |

TABLE 4

| site | occupancy | x | y | z |
|---|---|---|---|---|
| M(0,1)1 | 1 | 0.08405(5) | 0.517265 | −0.74677(6) |
| M(0,1)2 | 1 | 0.58104(4) | −0.01664(4) | 0.73684(6) |
| M(0,1)3 | 1 | 0.74895(4) | 0.49871(11) | −0.75193(6) |
| M(2,3)1 | 1 | 0.08979(18) | 0.1903(2) | −0.4430(3) |
| M(2,3)2 | 1 | 0.59158(18) | 0.3117(2) | 0.4431(3) |
| M(2,3)3 | 1 | 0.40898(16) | 0.1656(2) | −0.5106(3) |
| M(2,3)4 | 1 | 0.90852(18) | 0.3403(2) | 0.5148(2) |
| M(2,3)5a | 0.5 | 0.7776(3) | 0.1668(4) | −0.5103(5) |
| M(2,3)5b | 0.5 | 0.7223(4) | 0.1841(5) | 0.5570(7) |
| M(2,3)6a | 0.5 | 0.2770(3) | 0.3383(5) | 0.5136(5) |
| M(2,3)6b | 0.5 | 0.2215(3) | 0.3178(4) | 0.4420(6) |
| M(2,3)7 | 1 | 0.10065(17) | 0.6428(2) | −0.1522(3) |
| M(2,3)8 | 1 | 0.60206(18) | −0.1604(2) | 0.1383(3) |
| M(2,3)9 | 1 | 0.30049(19) | 0.6408(2) | −0.1370(3) |
| M(2,3)10 | 1 | 0.80168(14) | −0.1554(2) | 0.1266(3) |
| M(2,3)11 | 1 | 0.50024(15) | 0.6374(2) | −0.1348(3) |
| M(2,3)12 | 1 | 0.99998(17) | −0.1517(3) | 0.1244(3) |
| M(2,3)13 | 1 | 0.69884(16) | 0.6390(2) | −0.1447(3) |
| M(2,3)14 | 1 | 1.19840(18) | −0.1546(3) | 0.1310(3) |
| M(2,3)15 | 1 | 0.89924(18) | 0.6473(2) | −0.1430(3) |
| M(2,3)16 | 1 | 1.39950(17) | −0.1617(2) | 0.1320(2) |
| M(O,N)1 | 1 | 0.4149(7) | −0.0051(9) | −0.4099(6) |
| M(O,N)2 | 1 | 0.9157(6) | 0.5041(5) | 0.4086(7) |
| M(O,N)3 | 1 | 0.7504(7) | 0.0033(10) | −0.4079(7) |
| M(O,N)4 | 1 | 0.4979(6) | 0.2285(7) | −0.6514(10) |
| M(O,N)5 | 1 | 0.9992(4) | 0.2896(6) | 0.6541(8) |
| M(O,N)6 | 1 | 0.6897(4) | 0.2283(7) | −0.6545(9) |
| M(O,N)7 | 1 | 1.1914(5) | 0.2625(7) | 0.6551(10) |
| M(O,N)8 | 1 | 0.3109(4) | 0.2058(6) | −0.6424(8) |
| M(O,N)9 | 1 | 0.8099(5) | 0.2957(10) | 0.6427(11) |
| M(O,N)10a | 0.5 | 0.0949(11) | 0.2415(14) | 0.3398(16) |
| M(O,N)10b | 0.5 | 0.1159(8) | 0.2543(11) | 0.3489(14) |
| M(O,N)11a | 0.5 | 0.5942(12) | 0.2572(17) | 0.658(2) |
| M(O,N)11b | 0.5 | 0.6148(9) | 0.2608(13) | 0.6613(17) |
| M(O,N)12a | 0.5 | 0.8802(10) | 0.2100(15) | −0.6333(18) |
| M(O,N)12b | 0.5 | 0.9034(13) | 0.2001(17) | −0.6352(19) |
| M(O,N)13a | 0.5 | 0.3796(8) | 0.3153(11) | 0.6378(14) |
| M(O,N)13b | 0.5 | 0.3996(14) | 0.300(2) | 0.645(2) |
| M(O,N)14 | 1 | 1.1006(4) | 0.2897(5) | −0.0154(6) |
| M(O,N)15 | 1 | 0.9996(5) | 0.0389(6) | −0.8842(9) |

TABLE 4-continued

| site | occupancy | x | y | z |
|---|---|---|---|---|
| M(O,N)16 | 1 | 0.7039(5) | 0.2817(6) | −0.0224(8) |
| M(O,N)17 | 1 | 0.4979(5) | 0.2704(6) | −0.0287(8) |
| M(O,N)18 | 1 | 0.4015(5) | 0.0324(5) | −0.8798(6) |
| M(O,N)19 | 1 | 0.7982(4) | 0.0367(5) | −0.8784(8) |
| M(O,N)20 | 1 | 0.2990(5) | 0.2707(6) | −0.0304(9) |
| M(O,N)21 | 1 | 1.1996(4) | 0.0389(6) | −0.8933(7) |
| M(O,N)22 | 1 | 0.6001(5) | 0.0329(4) | −0.9024(6) |
| M(O,N)23 | 1 | 0.8990(4) | 0.2760(5) | −0.0207(7) |

Examples 11 to 28

Examples 11 to 28 of the phosphor according to the invention will be described.

Silicon nitride powder, aluminum nitride powder, strontium nitride powder, strontium oxide powder and europium oxide powder each having an average particle diameter of 0.5 μm, an oxygen content of 0.93% by weight and an α type content of 92% were used as the raw material powder.

In the general formula: $M(0)_aM(1)_bM(2)_{x-(vm+n)}M(3)_{(vm+n)-y}O_nN_{z-n}$, the above-described raw material powder was weighed at a composition shown in Table 6 so as to take the values of a, b, m, x, y, z and n shown in Table 5 and the raw material powder was mixed using an agate pestle and a mortar for 30 minutes. M(1) was Eu.

TABLE 5

| | a | b | m | x | y | z | n |
|---|---|---|---|---|---|---|---|
| Example 11 | 5.820 | 0.180 | 6.000 | 33.000 | 8.000 | 36.000 | 6.000 |
| Example 12 | 5.820 | 0.180 | 6.000 | 35.250 | 8.500 | 38.500 | 6.000 |
| Example 13 | 5.820 | 0.180 | 6.000 | 37.500 | 9.000 | 41.000 | 6.000 |
| Example 14 | 5.820 | 0.180 | 6.000 | 39.750 | 9.500 | 43.500 | 6.000 |
| Example 15 | 5.820 | 0.180 | 6.000 | 44.250 | 10.500 | 48.500 | 6.000 |
| Example 16 | 5.820 | 0.180 | 6.000 | 46.500 | 11.000 | 51.000 | 6.000 |
| Example 17 | 5.820 | 0.180 | 6.000 | 48.750 | 11.500 | 53.500 | 6.000 |
| Example 18 | 5.820 | 0.180 | 6.000 | 51.000 | 12.000 | 56.000 | 6.000 |
| Example 19 | 5.820 | 0.180 | 6.000 | 33.000 | 8.000 | 36.000 | 4.300 |
| Example 20 | 5.820 | 0.180 | 6.000 | 35.250 | 8.500 | 38.500 | 4.300 |
| Example 21 | 5.820 | 0.180 | 6.000 | 37.500 | 9.000 | 41.000 | 4.300 |
| Example 22 | 5.820 | 0.180 | 6.000 | 39.750 | 9.500 | 43.500 | 4.300 |
| Example 23 | 5.820 | 0.180 | 6.000 | 44.250 | 10.500 | 48.500 | 4.300 |
| Example 24 | 5.820 | 0.180 | 6.000 | 46.500 | 11.000 | 51.000 | 4.300 |
| Example 25 | 5.820 | 0.180 | 6.000 | 48.750 | 11.500 | 53.500 | 4.300 |
| Example 26 | 5.820 | 0.180 | 6.000 | 51.000 | 12.000 | 56.000 | 4.300 |
| Example 27 | 5.820 | 0.180 | 6.000 | 45.000 | 12.000 | 48.000 | 6.000 |
| Example 28 | 2.820 | 0.180 | 3.000 | 33.000 | 8.000 | 36.000 | 3.000 |

TABLE 6

|  | SrO(g) | Sr$_3$N$_2$(g) | Si$_3$N$_4$(g) | AlN(g) | Eu$_2$O$_3$(g) | light emitting intensity (count) | light emitting wavelength (nm) |
| --- | --- | --- | --- | --- | --- | --- | --- |
| Example 11 | 3.454 | 0 | 4.017 | 2.348 | 0.181 | 95 | 503 |
| Example 12 | 3.294 | 0 | 4.406 | 2.127 | 0.173 | 96 | 504 |
| Example 13 | 3.149 | 0 | 4.76 | 1.926 | 0.165 | 98 | 504 |
| Example 14 | 3.015 | 0 | 5.085 | 1.742 | 0.158 | 98 | 503 |
| Example 15 | 2.78 | 0 | 5.657 | 1.417 | 0.146 | 99 | 504 |
| Example 16 | 2.675 | 0 | 5.911 | 1.273 | 0.141 | 97 | 504 |
| Example 17 | 2.578 | 0 | 6.147 | 1.139 | 0.135 | 97 | 503 |
| Example 18 | 2.488 | 0 | 6.366 | 1.015 | 0.131 | 96 | 504 |
| Example 19 | 2.447 | 0.945 | 4.476 | 1.950 | 0.182 | 96 | 504 |
| Example 20 | 2.334 | 0.901 | 4.844 | 1.748 | 0.173 | 97 | 505 |
| Example 21 | 2.231 | 0.861 | 5.179 | 1.563 | 0.166 | 101 | 505 |
| Example 22 | 2.136 | 0.825 | 5.486 | 1.395 | 0.158 | 101 | 504 |
| Example 23 | 1.969 | 0.76 | 6.028 | 1.097 | 0.146 | 100 | 505 |
| Example 24 | 1.895 | 0.732 | 6.268 | 0.964 | 0.141 | 99 | 505 |
| Example 25 | 1.826 | 0.705 | 6.491 | 0.842 | 0.135 | 97 | 506 |
| Example 26 | 1.763 | 0.681 | 6.699 | 0.728 | 0.131 | 95 | 504 |
| Example 27 | 2.814 | 0 | 5.891 | 1.148 | 0.148 | 101 | 504 |
| Example 28 | 1.965 | 0 | 7.546 | 0.276 | 0.213 | 92 | 503 |

The obtained powder mixture was placed in an aluminum mold, and a compact with a bulk density of about 26% was fabricated. The compact was then filled in a boron nitride crucible. The ratio of the compact volume to the crucible volume was about 80%. The powder was weighed, mixed and molded in a glove box which can maintain a nitrogen atmosphere with a moisture content of not more than 1 ppm and an oxygen content of not more than 1 ppm.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, the powder was heated from room temperature to 1000° C. at a speed of 500° C./h, nitrogen with a purity of 99.999% by volume was introduced at 1000° C., the pressure was controlled to be 0.9 MPa, the temperature was increased to 1900° C. at 600° C./h, and the powder was kept at a temperature of 1900° C. for two hours.

After the sintering step, the obtained sintered product was subject to course grinding, grinding by hand in a mortar of a silicon nitride sintered product, and then screening using a 30-μm sieve to provide a phosphor powder (Examples 11 to 28) having an average particle diameter of 12 μm.

First, the light emission spectrum and the excitation spectrum of the phosphor powder (Examples 11 to 28) were measured using a fluorescence spectrophotometer.

Figure 8:
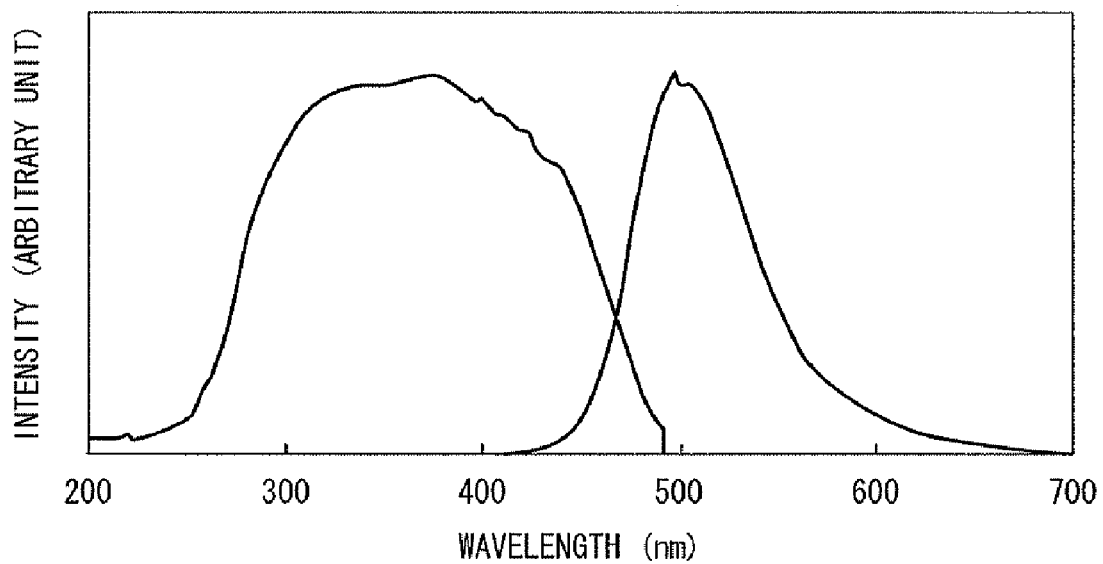
FIG. 8 illustrates light emission and an excitation spectrum of a phosphor of Example 24 according to the invention.

FIG. 8 illustrates measurement results of the light emission spectrum and the excitation spectrum of the phosphor of Example 24. As illustrated in FIG. 8, the peak wavelength of the excitation spectrum of the phosphor of Example 24 was 370 nm, and the peak wavelength of the light emission spectrum excited with 450-nm blue light was 505 nm. The light emitting intensity of the peak wavelength was 99 counts.

Figure 9:
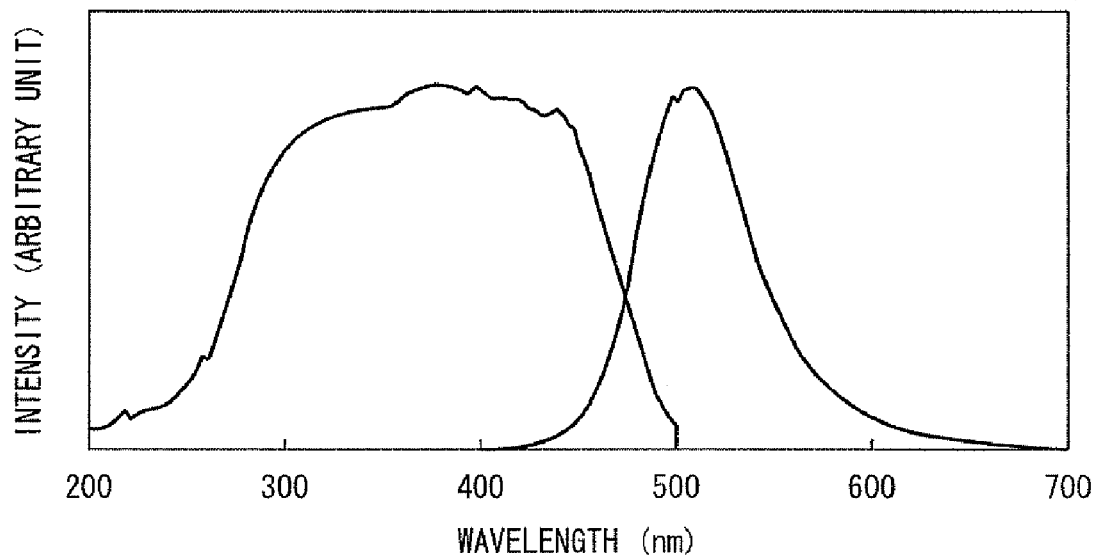
FIG. 9 illustrates light emission and an excitation spectrum of a phosphor of Example 27 according to the invention.

FIG. 9 illustrates measurement results of the light emission spectrum and the excitation spectrum of the phosphor of Example 27. As illustrated in FIG. 9, the peak wavelength of the excitation spectrum of the phosphor of Example 27 was 370 nm, and the peak wavelength of the light emission spectrum excited with 450-nm blue light was 504 nm. The light emitting intensity of the peak wavelength was 101 counts.

The peak wavelength of the excitation spectrum of each phosphor was 370 nm and the phosphor emitted blue-green light when excited with 450-nm blue light. The light emitting intensity and the light emission wavelength at the light emission peak of the phosphor powder (Examples 11 to 28) are shown in Table 6. The counted value of the light emitting intensity is based on an arbitrary unit value.

FIG. 11 illustrates a measurement result of a powder X-ray diffraction pattern of the phosphor of Example 24. A powder X-ray diffraction pattern consisting of a main diffraction peak was obtained as illustrated in FIG. 11.

Figure 12:
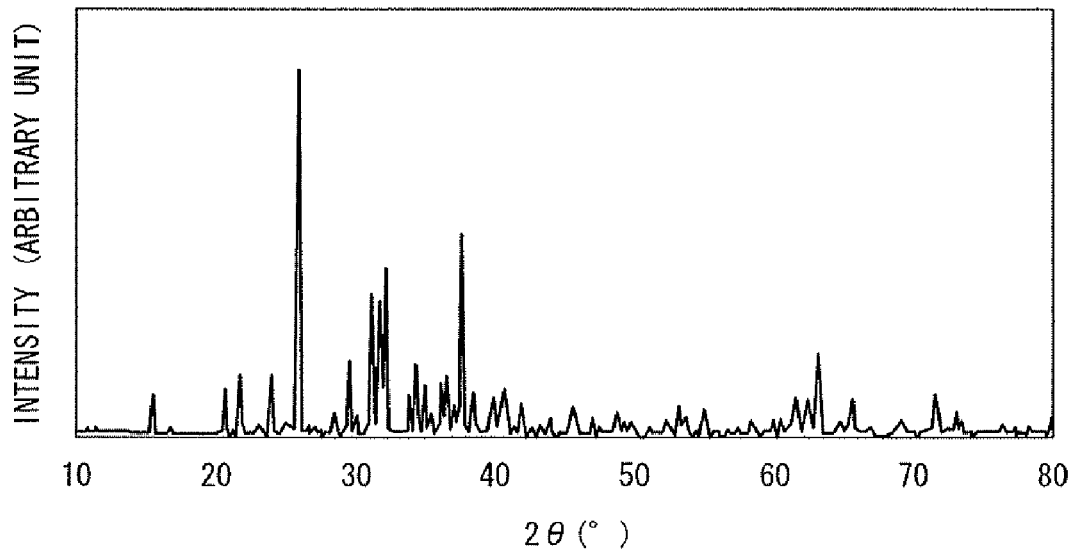
FIG. 12 is a powder X-ray diffraction chart of the phosphor of Example 24 according to the invention.
Figure 13:
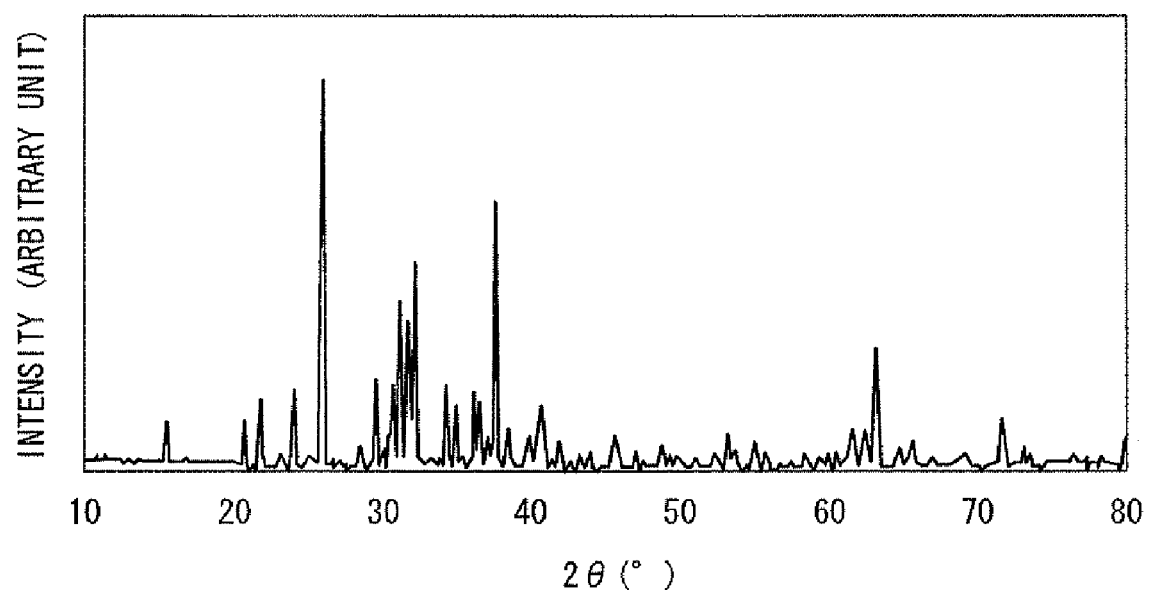
FIG. 13 is a powder X-ray diffraction chart of the phosphor of Example 27 according to the invention.

FIG. 12 illustrates a measurement result of a powder X-ray diffraction pattern of the phosphor of Example 27. A powder X-ray diffraction pattern consisting of a main diffraction peak was obtained as illustrated in FIG. 12.

Powder X-ray diffraction patterns consisting of a main diffraction peak were also obtained in the phosphor powder (Examples 11 to 23, 23 to 26 and 28) as in Example 1.

The phosphor powder (Examples 11 to 28) was exposed to an environment with a humidity of 80% and a temperature of 80° C. for 100 hours. Substantially no decrease in brightness was observed.

Next, the phosphor powder (Examples 11 to 28) was observed using an optical microscope while irradiating the phosphor powder with a 365-nm ultraviolet ray as needed.

On the basis of the color of the samples, the particle shape, and the light emission color when irradiated with ultraviolet light, it was confirmed that the volume ratio of a non-light emitting phase consisting of one or more materials selected from β-sialon, unreacted silicon nitride or aluminum nitride, oxynitride glass, SrSiAl$_2$N$_2$O$_3$, Sr$_2$Al$_2$Si$_{10}$N$_{14}$O$_4$, SrSi$_{(10-n)}$Al$_{(18+n)}$O$_n$N$_{(32-n)}$ (n~1), and SrSi$_6$N$_8$ or a crystal phase which emits light different from blue-green light near 504 nm was not more than 20%.

Examples 29 to 44

Examples 29 to 44 of the phosphor according to the invention will be described.

Silicon nitride powder, aluminum nitride powder, strontium nitride powder, strontium oxide powder, and europium oxide powder, each having an average particle diameter of 0.5 μm, an oxygen content of 0.93% by mass, and an α type content of 92%, were used as the raw material powder.

In the general formula: M(0)$_a$M(1)$_b$M(2)$_{x-(vm+n)}$M(3)$_{(vm+n)-y}$O$_n$N$_{z-n}$, the above-described raw material powder was weighed at a composition shown in Table 8 so as to take the values of a, b, m, x, y, z and n shown in Table 7, and then the raw material powder was mixed using an agate pestle and a mortar for 30 minutes. M(1) was Eu.

TABLE 7

|  | a | b | m | x | y | z | n |
|---|---|---|---|---|---|---|---|
| Example 29 | 5.940 | 0.060 | 6.000 | 42.000 | 10.000 | 46.000 | 6.000 |
| Example 30 | 5.880 | 0.120 | 6.000 | 42.000 | 10.000 | 46.000 | 6.000 |
| Example 31 | 5.760 | 0.240 | 6.000 | 42.000 | 10.000 | 46.000 | 6.000 |
| Example 32 | 5.700 | 0.300 | 6.000 | 42.000 | 10.000 | 46.000 | 6.000 |
| Example 33 | 5.550 | 0.450 | 6.000 | 42.000 | 10.000 | 46.000 | 6.000 |
| Example 34 | 5.400 | 0.600 | 6.000 | 42.000 | 10.000 | 46.000 | 6.000 |
| Example 35 | 5.100 | 0.900 | 6.000 | 42.000 | 10.000 | 46.000 | 6.000 |
| Example 36 | 4.800 | 1.200 | 6.000 | 42.000 | 10.000 | 46.000 | 6.000 |
| Example 37 | 5.940 | 0.060 | 6.000 | 42.000 | 10.000 | 46.000 | 4.300 |
| Example 38 | 5.880 | 0.120 | 6.000 | 42.000 | 10.000 | 46.000 | 4.300 |
| Example 39 | 5.760 | 0.240 | 6.000 | 42.000 | 10.000 | 46.000 | 4.300 |
| Example 40 | 5.700 | 0.300 | 6.000 | 42.000 | 10.000 | 46.000 | 4.300 |
| Example 41 | 5.550 | 0.450 | 6.000 | 42.000 | 10.000 | 46.000 | 4.300 |
| Example 42 | 5.400 | 0.600 | 6.000 | 42.000 | 10.000 | 46.000 | 4.300 |
| Example 43 | 5.100 | 0.900 | 6.000 | 42.000 | 10.000 | 46.000 | 4.300 |
| Example 44 | 4.800 | 1.200 | 6.000 | 42.000 | 10.000 | 46.000 | 4.300 |

TABLE 8

|  | SrO(g) | $Sr_3N_2$(g) | $Si_3N_4$(g) | AlN(g) | $Eu_2O_3$(g) | light emitting intensity (count) | light emitting wavelength (nm) |
|---|---|---|---|---|---|---|---|
| Example 29 | 2.965 | 0 | 5.405 | 1.579 | 0.051 | 91 | 493 |
| Example 30 | 2.929 | 0 | 5.394 | 1.576 | 0.101 | 97 | 500 |
| Example 31 | 2.857 | 0 | 5.371 | 1.570 | 0.202 | 98 | 508 |
| Example 32 | 2.821 | 0 | 5.36 | 1.566 | 0.252 | 95 | 510 |
| Example 33 | 2.733 | 0 | 5.333 | 1.558 | 0.376 | 94 | 513 |
| Example 34 | 2.645 | 0 | 5.305 | 1.550 | 0.499 | 91 | 519 |
| Example 35 | 2.473 | 0 | 5.251 | 1.535 | 0.741 | 87 | 523 |
| Example 36 | 2.304 | 0 | 5.199 | 1.519 | 0.978 | 84 | 526 |
| Example 37 | 2.118 | 0.795 | 5.792 | 1.245 | 0.051 | 93 | 494 |
| Example 38 | 2.083 | 0.793 | 5.78 | 1.242 | 0.102 | 100 | 502 |
| Example 39 | 2.015 | 0.79 | 5.756 | 1.237 | 0.202 | 102 | 508 |
| Example 40 | 1.981 | 0.788 | 5.744 | 1.234 | 0.252 | 100 | 512 |
| Example 41 | 1.897 | 0.784 | 5.714 | 1.228 | 0.377 | 97 | 516 |
| Example 42 | 1.814 | 0.78 | 5.685 | 1.222 | 0.5 | 93 | 521 |
| Example 43 | 1.650 | 0.772 | 5.627 | 1.209 | 0.742 | 92 | 524 |
| Example 44 | 1.489 | 0.764 | 5.571 | 1.197 | 0.979 | 89 | 528 |

The obtained powder mixture was placed in an aluminum mold, and a compact with bulk density of about 24% was fabricated. The compact was then filled in a boron nitride crucible. The ratio of the compact volume to the crucible volume was about 80%. The powder was weighed, mixed, and molded in a glove box which can maintain a nitrogen atmosphere with a moisture content of not more than 1 ppm and an oxygen content of not more than 1 ppm.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, then the powder was heated from room temperature to 1000° C. at a speed of 500° C./h, nitrogen with a purity of 99.999% by volume was introduced at 1000° C., the pressure was controlled to be 0.9 MPa, the temperature was increased to 1900° C. at 600° C./h, and the powder was kept at a temperature of 1900° C. for two hours.

After the sintering step, the obtained sintered product was subject to course grinding, grinding by hand in a mortar of a silicon nitride sintered product and then screening using a 30-μm sieve to provide phosphor powder (Examples 29 to 44) having an average particle diameter of 12 μm.

First, a light emission spectrum and an excitation spectrum of the phosphor powder (Examples 29 to 44) were measured using a fluorescence spectrophotometer.

The peak wavelength of the excitation spectrum of each phosphor was 370 nm and the phosphor emitted blue-green light when excited with 450-nm blue light. The light emitting intensity and the light emission wavelength at the light emission peak of the phosphor powder (Examples 29 to 44) are shown in Table 8. The counted value of the light emitting intensity is based on an arbitrary unit value.

Powder X-ray diffraction patterns consisting of a main diffraction peak were also obtained in the phosphor powder (Examples 29 to 44) as in Example 1.

The phosphor powder (Examples 29 to 44) was exposed to an environment with a humidity of 80% and a temperature of 80° C. for 100 hours. Substantially no decrease in brightness was observed.

Next, the phosphor powder (Examples 29 to 44) was observed using an optical microscope while irradiating the phosphor powder with 365-nm ultraviolet ray as needed.

On the basis of color of the samples, particle shape and light emission color when irradiated with ultraviolet light, it was confirmed that the volume ratio of a non-light emitting phase consisting of one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$ to a crystal phase which emits light different from blue-green light near 504 nm was not more than 20%.

Examples 45 to 56

Examples 45 to 56 of the phosphor according to the invention will be described.

A silicon nitride powder, an aluminum nitride powder, an aluminum nitride powder, a strontium nitride powder, a strontium oxide powder, a calcium oxide powder and an europium oxide powder each having an average particle diameter of 0.5 μm, an oxygen content of 0.93% by weight, and an α type content of 92% were used as the raw material powder.

In the general formula: $M(0)_aM(1)_bM(2)_{x-(vm+n)}M(3)_{(vm+n)-y}O_nN_{z-n}$, the above-described raw material powder was weighed at a composition shown in Table 10 so as to take the values of a, b, m, x, y, z and n shown in Table 9 and the raw material powder was mixed using an agate pestle and mortar for 30 minutes. M(1) was Eu.

TABLE 9

| | a | | b | m | x | y | z | n |
|---|---|---|---|---|---|---|---|---|
| | Sr | Ca | | | | | | |
| Example 45 | 0.000 | 5.820 | 0.180 | 6.000 | 42.000 | 10.000 | 46.000 | 6.000 |
| Example 46 | 0.820 | 5.000 | 0.180 | 6.000 | 42.000 | 10.000 | 46.000 | 6.000 |
| Example 47 | 1.820 | 4.000 | 0.180 | 6.000 | 42.000 | 10.000 | 46.000 | 6.000 |
| Example 48 | 2.820 | 3.000 | 0.180 | 6.000 | 42.000 | 10.000 | 46.000 | 6.000 |
| Example 49 | 3.820 | 2.000 | 0.180 | 6.000 | 42.000 | 10.000 | 46.000 | 6.000 |
| Example 50 | 4.820 | 1.000 | 0.180 | 6.000 | 42.000 | 10.000 | 46.000 | 6.000 |
| Example 51 | 5.320 | 0.500 | 0.180 | 6.000 | 42.000 | 10.000 | 46.000 | 6.000 |
| Example 52 | 1.820 | 4.000 | 0.180 | 6.000 | 42.000 | 10.000 | 46.000 | 4.300 |
| Example 53 | 2.820 | 3.000 | 0.180 | 6.000 | 42.000 | 10.000 | 46.000 | 4.300 |
| Example 54 | 3.820 | 2.000 | 0.180 | 6.000 | 42.000 | 10.000 | 46.000 | 4.300 |
| Example 55 | 4.820 | 1.000 | 0.180 | 6.000 | 42.000 | 10.000 | 46.000 | 4.300 |
| Example 56 | 5.320 | 0.500 | 0.180 | 6.000 | 42.000 | 10.000 | 46.000 | 4.300 |

TABLE 10

| | SrO(g) | CaO(g) | $Sr_3N_2$(g) | $Si_3N_4$(g) | AlN(g) | $Eu_2O_3$(g) | light emitting intensity (count) | light emitting wavelength (nm) |
|---|---|---|---|---|---|---|---|---|
| Example 45 | 0 | 1.805 | 0 | 6.206 | 1.814 | 0.175 | 88 | 570 |
| Example 46 | 0.46 | 1.518 | 0 | 6.075 | 1.775 | 0.171 | 91 | 563 |
| Example 47 | 0.995 | 1.184 | 0 | 5.923 | 1.731 | 0.167 | 94 | 548 |
| Example 48 | 1.505 | 0.866 | 0 | 5.778 | 1.688 | 0.163 | 96 | 532 |
| Example 49 | 1.989 | 0.564 | 0 | 5.64 | 1.648 | 0.159 | 97 | 523 |
| Example 50 | 2.452 | 0.275 | 0 | 5.508 | 1.61 | 0.155 | 99 | 511 |
| Example 51 | 2.675 | 0.136 | 0 | 5.445 | 1.591 | 0.154 | 99 | 507 |
| Example 52 | 0.066 | 1.185 | 0.871 | 6.347 | 1.364 | 0.167 | 92 | 551 |
| Example 53 | 0.598 | 0.867 | 0.849 | 6.192 | 1.331 | 0.163 | 96 | 533 |
| Example 54 | 1.105 | 0.564 | 0.829 | 6.044 | 1.299 | 0.159 | 97 | 526 |
| Example 55 | 1.588 | 0.276 | 0.81 | 5.903 | 1.269 | 0.156 | 99 | 512 |
| Example 56 | 1.821 | 0.136 | 0.8 | 5.835 | 1.254 | 0.154 | 100 | 508 |

The obtained powder mixture was placed in an aluminum mold and a compact with a bulk density of about 25% was fabricated. The compact was then filled in a boron nitride crucible. The ratio of the compact volume and the crucible volume was about 80%. The powder was weighed, mixed and molded in ambient air.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, the powder was heated from room temperature to 1000° C. at a speed of 500° C./h, nitrogen with 99.999% by volume purity was introduced at 1000° C., pressure was controlled to be 0.9 MPa, the temperature was increased to 1900° C. at 600° C./h and the powder was kept at a temperature of 1900° C. for two hours.

After the sintering step, the obtained sintered product was subject to course grinding, grinding by hand in a mortar of a silicon nitride sintered product and then screening using a 30-μm sieve to provide phosphor powder (Examples 45 to 56) having an average particle diameter of 12 μm.

First, a light emission spectrum and an excitation spectrum of the phosphor powder (Examples 45 to 56) were measured using a fluorescence spectrophotometer.

The peak wavelength of the excitation spectrum of each phosphor was 370 nm and the phosphor emitted blue-green to yellow light when excited with 450-nm blue light. The light emitting intensity and the light emission wavelength at the light emission peak of the phosphor powder (Examples 45 to 56) are shown in Table 10. The counted value of the light emitting intensity is based on an arbitrary unit value.

Powder X-ray diffraction patterns consisting of a main diffraction peak were also obtained in the phosphor powder (Examples 45 to 56) as in Example 1.

The phosphor powder (Examples 45 to 56) was exposed to an environment with a humidity of 80% and a temperature of 80° C. for 100 hours. Substantially no decrease in brightness was observed.

Next, the phosphor powder (Examples 45 to 56) was observed using a optical microscope while irradiating the phosphor powder with 365-nm ultraviolet ray as needed.

On the basis of the color of the samples, the particle shape and the light emission color when irradiated with ultraviolet light, it was confirmed that the volume ratio of non-light emitting phase consisting of one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18-n)}O_nN_{(32-n)}$ (n~1) and $SrSi_6N_8$ to a crystal phase which emits light different from blue-green light near 504 nm was not more than 20%.

Examples 57 to 68

Examples 57 to 68 of the phosphor according to the invention will be described.

A silicon nitride powder, an aluminum nitride powder, a strontium nitride powder, a strontium oxide powder, a barium oxide powder and an europium oxide powder each having an average particle diameter of 0.5 μm, an oxygen content of 0.93% by weight and an α type content of 92% were used as the raw material powder.

In the general formula: $M(0)_aM(1)_bM(2)_{x-(vm+n)}M(3)_{(vm+n)-y}O_nN_{z-n}$, the above-described raw material powder was weighed at a composition shown in Table 12 so as to take the values of a, b, m, x, y, z and n shown in Table 11 and the raw material powder was mixed using an agate pestle and mortar for 30 minutes. M(1) was Eu.

TABLE 11

| | a | | b | m | x | y | z | n |
|---|---|---|---|---|---|---|---|---|
| | Sr | Ba | | | | | | |
| Example 57 | 0.000 | 5.820 | 0.180 | 6.000 | 42.000 | 10.000 | 46.000 | 6.000 |
| Example 58 | 0.820 | 5.000 | 0.180 | 6.000 | 42.000 | 10.000 | 46.000 | 6.000 |
| Example 59 | 1.820 | 4.000 | 0.180 | 6.000 | 42.000 | 10.000 | 46.000 | 6.000 |
| Example 60 | 2.820 | 3.000 | 0.180 | 6.000 | 42.000 | 10.000 | 46.000 | 6.000 |
| Example 61 | 3.820 | 2.000 | 0.180 | 6.000 | 42.000 | 10.000 | 46.000 | 6.000 |
| Example 62 | 4.820 | 1.000 | 0.180 | 6.000 | 42.000 | 10.000 | 46.000 | 6.000 |
| Example 63 | 5.320 | 0.500 | 0.180 | 6.000 | 42.000 | 10.000 | 46.000 | 6.000 |
| Example 64 | 1.820 | 4.000 | 0.180 | 6.000 | 42.000 | 10.000 | 46.000 | 4.300 |
| Example 65 | 2.820 | 3.000 | 0.180 | 6.000 | 42.000 | 10.000 | 46.000 | 4.300 |
| Example 66 | 3.820 | 2.000 | 0.180 | 6.000 | 42.000 | 10.000 | 46.000 | 4.300 |
| Example 67 | 4.820 | 1.000 | 0.180 | 6.000 | 42.000 | 10.000 | 46.000 | 4.300 |
| Example 68 | 5.320 | 0.500 | 0.180 | 6.000 | 42.000 | 10.000 | 46.000 | 4.300 |

TABLE 12

| | SrO(g) | BaO(g) | Sr₃N₂(g) | Si₃N₄(g) | AlN(g) | Eu₂O₃(g) | light emitting intensity (count) | light emitting wavelength (nm) |
|---|---|---|---|---|---|---|---|---|
| Example 57 | 0 | 3.758 | 0 | 4.727 | 1.381 | 0.133 | 113 | 446 |
| Example 58 | 0.364 | 3.285 | 0 | 4.809 | 1.405 | 0.136 | 110 | 453 |
| Example 59 | 0.826 | 2.685 | 0 | 4.914 | 1.436 | 0.139 | 107 | 463 |
| Example 60 | 1.308 | 2.059 | 0 | 5.023 | 1.468 | 0.142 | 106 | 475 |
| Example 61 | 1.812 | 1.404 | 0 | 5.138 | 1.501 | 0.145 | 103 | 486 |
| Example 62 | 2.34 | 0.718 | 0 | 5.257 | 1.536 | 0.148 | 101 | 498 |
| Example 63 | 2.613 | 0.363 | 0 | 5.319 | 1.554 | 0.15 | 100 | 503 |
| Example 64 | 0.054 | 2.687 | 0.722 | 5.266 | 1.132 | 0.139 | 109 | 465 |
| Example 65 | 0.52 | 2.060 | 0.738 | 5.383 | 1.157 | 0.142 | 107 | 475 |
| Example 66 | 1.006 | 1.405 | 0.755 | 5.505 | 1.183 | 0.145 | 104 | 489 |
| Example 67 | 1.516 | 0.719 | 0.773 | 5.634 | 1.211 | 0.148 | 102 | 501 |
| Example 68 | 1.779 | 0.364 | 0.782 | 5.7 | 1.225 | 0.15 | 101 | 503 |

The obtained powder mixture was placed in an aluminum mold and a compact with a bulk density of about 23% was fabricated. The compact was then filled in a boron nitride crucible. The ratio of the compact volume to the crucible volume was about 80%. The powder was weighed, mixed and molded in ambient air.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, the powder was heated from a room temperature to 1000° C. at a speed of 500° C./h, nitrogen with 99.999% by volume purity was introduced at 1000° C., the pressure was controlled to be 0.9 MPa, the temperature was increased to 1900° C. at 600° C./h, and the powder was kept at a temperature of 1900° C. for two hours.

After the sintering step, the obtained sintered product was subject to course grinding, grinding by hand in a mortar of a silicon nitride sintered product and then screening using a 30-μm sieve to provide phosphor powder (Examples 57 to 68) having an average particle diameter of 11 μm.

First, the light emission spectrum and the excitation spectrum of the phosphor powder (Examples 57 to 68) were measured using a fluorescence spectrophotometer.

The peak wavelength of the excitation spectrum of each phosphor was 370 nm and the phosphor emitted blue to blue-green light when excited with 400-nm blue-purple light. The light emitting intensity and the light emission wavelength at the light emitting peak of the phosphor powder (Examples 57 to 68) are shown in Table 12. The counted value of the light emitting intensity is based on an arbitrary unit value.

Powder X-ray diffraction patterns consisting of a main diffraction peak were also obtained in the phosphor powder (Examples 57 to 68) as in Example 1.

The phosphor powder (Examples 57 to 68) was exposed to an environment with humidity of 80% and a temperature of 80° C. for 100 hours. Substantially no decrease in brightness was observed.

Next, the phosphor powder (Examples 57 to 68) was observed using an optical microscope while irradiating the phosphor powder with a 365-nm ultraviolet ray as needed.

On the basis of color of the samples, the particle shape and the light emission color when irradiated with ultraviolet light, it was confirmed that the volume ratio of non-light emitting phase consisting of one or more materials selected from β-sialon, unreacted silicon nitride or aluminum nitride, oxynitride glass, $SrSiAl_2Al_2N_2O_3$, $Sr_2Al_2Si_{10}N_{14}O_4$, $SrSi_{(10-n)}Al_{(18+n)}O_nN_{(32-n)}$ (n~1) and $SrSi_6N_3$ to a crystal phase which emits light different from blue-green light near 504 nm was not more than 20%.

Examples 69 to 73

Examples 69 to 73 of the phosphor according to the invention will be described.

A silicon nitride powder, an aluminum nitride powder, a strontium oxide powder, a strontium carbonate powder, a $SrSi_2$ powder, a $Sr_2Si_5N_8$ powder, a $SrSi_6N_8$ powder, a $SrSiN_2$ powder and an europium oxide powder each having an average particle diameter of 0.5 μm, an oxygen content of 0.93% by weight and an a type content of 92% were used as the raw material powder.

In the general formula: $M(0)_aM(1)_bM(2)_{x-(vm+n)}M(3)_{(vm+n)-y}O_nN_{z-n}$, the above-described raw material powder was weighed at a composition shown in Table 14 so as to take the values of a, b, m, x, y, z and n shown in Table 13 and the raw material powder was mixed using an agate pestle and mortar for 30 minutes. M(1) was Eu.

TABLE 13

| | a | b | m | x | y | z | n |
|---|---|---|---|---|---|---|---|
| Example 69 | 5.820 | 0.180 | 6.000 | 42.000 | 10.000 | 46.000 | 4.300 |
| Example 70 | 5.820 | 0.180 | 6.000 | 42.000 | 10 | 46.000 | 6.000 |
| Example 71 | 5.820 | 0.180 | 6.000 | 42.000 | 10.000 | 46.000 | 4.300 |
| Example 72 | 5.820 | 0.180 | 6.000 | 42.000 | 10.000 | 46.000 | 4.300 |
| Example 73 | 5.820 | 0.180 | 6.000 | 42.000 | 10.000 | 46.000 | 4.300 |

TABLE 14

| | SrO (g) | SrCO$_3$(g) | SrSi$_2$(g) | Sr$_2$Si$_5$N$_8$(g) | SrSi$_6$N$_8$(g) | SrSiN$_2$(g) | Si$_3$N$_4$(g) | AlN(g) | Eu$_2$O$_3$(g) | light emitting intensity (count) | light emitting wavelength (nm) |
|---|---|---|---|---|---|---|---|---|---|---|---|
| Example 69 | 2.130 | — | 1.220 | — | — | — | 5.203 | 1.289 | 0.158 | 104 | 505 |
| Example 70 | — | 3.67 | — | — | — | — | 4.794 | 1.401 | 0.135 | 101 | 504 |
| Example 71 | 2.049 | — | — | 1.745 | — | — | 4.814 | 1.240 | 0.152 | 107 | 505 |
| Example 72 | 2.065 | — | — | — | 3.027 | — | 3.505 | 1.249 | 0.153 | 105 | 505 |
| Example 73 | 2.049 | — | — | — | — | 1.173 | 5.386 | 1.240 | 0.152 | 104 | 505 |

The obtained powder mixture was placed in an aluminum mold and a compact with a bulk density of about 24% was fabricated. The compact was then filled in a boron nitride crucible. The ratio of the compact volume to the crucible volume was about 80%. The powder was weighed, mixed and molded in ambient air.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, the powder was heated from room temperature to 1000° C. at a speed of 500° C./h, nitrogen with 99.999% by volume purity was introduced at 1000° C., the pressure was controlled to be 0.9 MPa, the temperature was increased to 1900° C. at 600° C./h and the powder was kept at a temperature 1900° C. for two hours.

After the sintering step, the obtained sintered product was subject to course grinding, grinding by hand in a mortar of a silicon nitride sintered product and then screening using a 30-μm sieve to provide phosphor powder (Examples 69 to 73) having an average particle diameter of 12 μm.

First, a light emission spectrum and an excitation spectrum of the phosphor powder (Examples 69 to 73) were measured using a fluorescence spectrophotometer.

The peak wavelength of the excitation spectrum of each phosphor was 370 nm and the phosphor emitted blue-green light when excited with 450-nm blue light. The light emitting intensity and the light emission wavelength at the light emission peak of the phosphor powder (Examples 69 to 73) are shown in Table 14. The counted value of the light emitting intensity is based on an arbitrary unit value.

Powder X-ray diffraction patterns consisting of a main diffraction peak were also obtained in the phosphor powder (Examples 69 to 73) as in Example 1.

The phosphor powder (Examples 69 to 73) was exposed to an environment with a humidity of 80% and a temperature of 80° C. for 100 hours. Substantially no decrease in brightness was observed.

Next, the phosphor powder (Examples 69 to 73) was observed using an optical microscope while irradiating the phosphor powder with 365-nm ultraviolet ray as needed.

On the basis of the color of the samples, the particle shape and the light emission color when irradiated with ultraviolet light, it was confirmed that the volume ratio of non-light emitting phase consisting of one or more materials selected from β-sialon, unreacted silicon nitride or aluminum nitride, oxynitride glass, SrSiAl$_2$N$_2$O$_3$, Sr$_2$Al$_2$Si$_{10}$N$_{14}$O$_4$, SrSi$_{(10-n)}$Al$_{(18+n)}$O$_n$N$_{(32-n)}$ (n~1) and SrSi$_6$N$_8$ or a crystal phase which emits light different from blue-green light near 504 nm was not more than 20%.

Examples 74 to 83

Examples 74 to 83 of the phosphor according to the invention will be described.

A silicon nitride powder, an aluminum nitride powder, a strontium oxide powder, a lanthanum oxide powder, lithium carbonate powders, a SrSi$_2$ powder, a Li$_3$N powder, a LiSi$_2$N$_3$ powder and an europium oxide powder each having an average particle diameter of 0.5 μm, an oxygen content of 0.93% by weight and an α type content of 92% were used as the raw material powder.

In the general formula: M(0)$_a$M(1)$_b$M(2)$_{x-(vm+n)}$M(3)$_{(vm+n)-y}$O$_n$N$_{z-n}$, the above-described raw material powder was weighed at a composition shown in Table 16 so as to take the values of a, b, m, x, y, z and n shown in Table 15 and the raw material powder was mixed using an agate pestle and a mortar for 30 minutes. M(1) was Eu.

TABLE 15

| | a | | | b | m | x | y | z | N |
|---|---|---|---|---|---|---|---|---|---|
| | Sr | La | Li | | | | | | |
| Example 74 | 4.820 | 1.000 | — | 0.180 | 6.000 | 42.000 | 10 | 46.000 | 6.500 |
| Example 75 | 3.820 | 2.000 | — | 0.180 | 6.000 | 42.000 | 10 | 46.000 | 7.000 |
| Example 76 | 2.820 | 3.000 | — | 0.180 | 6.000 | 42.000 | 10 | 46.000 | 7.500 |
| Example 77 | 4.820 | 1.000 | — | 0.180 | 6.000 | 42.000 | 10 | 46.000 | 4.800 |
| Example 78 | 4.820 | — | 1.000 | 0.180 | 6.000 | 42.000 | 10 | 46.000 | 5.500 |
| Example 79 | 3.820 | — | 2.000 | 0.180 | 6.000 | 42.000 | 10 | 46.000 | 5.000 |
| Example 80 | 2.820 | — | 3.000 | 0.180 | 6.000 | 42.000 | 10 | 46.000 | 4.500 |
| Example 81 | 4.820 | — | 1.000 | 0.180 | 6.000 | 42.000 | 10 | 46.000 | 4.000 |

TABLE 15-continued

| | a | | | b | m | x | y | z | N |
|---|---|---|---|---|---|---|---|---|---|
| | Sr | La | Li | | | | | | |
| Example 82 | 4.820 | — | 1.000 | 0.180 | 6.000 | 42.000 | 10 | 46.000 | 4.000 |
| Example 83 | 4.820 | — | 1.000 | 0.180 | 6.000 | 42.000 | 10 | 46.000 | 4.000 |

TABLE 16

| | SrO(g) | SrSi2 (g) | La$_2$O$_3$(g) | Li$_2$CO$_3$(g) | Li$_3$N(g) | LiSi$_2$N$_3$(g) | Si$_3$N$_4$(g) | AlN(g) | Eu$_2$O$_3$(g) | light emitting intensity (count) | light emitting wavelength (nm) |
|---|---|---|---|---|---|---|---|---|---|---|---|
| Example 74 | 2.338872 | 0.000 | 0.763 | — | — | — | 4.926456 | 1.823481 | 0.148321 | 101 | 505 |
| Example 75 | 1.810695 | 0.000 | 1.490 | — | — | — | 4.491525 | 2.062495 | 0.144886 | 102 | 507 |
| Example 76 | 1.306431 | 0.000 | 2.185 | — | — | — | 4.076286 | 2.290686 | 0.141606 | 104 | 508 |
| Example 77 | 1.573553 | 1.190 | 0.793 | — | — | — | 4.733503 | 1.556107 | 0.154159 | 105 | 508 |
| Example 78 | 2.464262 | 0.000 | — | 0.182 | — | — | 5.882644 | 1.314533 | 0.156273 | 102 | 503 |
| Example 79 | 2.010563 | 0.000 | — | 0.375 | — | — | 6.412254 | 1.040981 | 0.160878 | 103 | 500 |
| Example 80 | 1.52931 | 0.000 | — | 0.580 | — | — | 6.97403 | 0.750814 | 0.165764 | 105 | 498 |
| Example 81 | 1.759318 | 1.103 | — | 0.189 | — | — | 5.738653 | 1.04808 | 0.161976 | 105 | 503 |
| Example 82 | 2.022895 | 0.735 | — | — | 0.059 | — | 5.973688 | 1.047365 | 0.161865 | 106 | 503 |
| Example 83 | 2.022884 | 0.735 | — | — | — | 0.537281 | 5.495762 | 1.047359 | 0.161864 | 108 | 503 |

The obtained powder mixture was placed in an aluminum mold and a compact with a bulk density of about 23% was fabricated. The compact was then filled in a boron nitride crucible. The ratio of the compact volume to the crucible volume was about 80%. The powder was weighed, mixed and molded in a glove box which can keep a nitrogen atmosphere with a moisture content of not more than 1 ppm and an oxygen content of not more than 1 ppm.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, the powder was heated from room temperature to 1000° C. at a speed of 500° C./h, nitrogen with a purity of 99.999% by volume was introduced at 1000° C., the pressure was controlled to 0.9 MPa, the temperature was increased to 1900° C. at 600° C./h and the powder was kept at a temperature of 1900° C. for two hours.

After the sintering step, the obtained sintered product was subject to course grinding, grinding by hand in a mortar of a silicon nitride sintered product and then screening using a 30-μm sieve to provide a phosphor powder (Examples 74 to 83) having an average particle diameter of 11 μm.

First, a light emission spectrum and an excitation spectrum of the phosphor powder (Examples 74 to 83) were measured using a fluorescence spectrophotometer.

The peak wavelength of the excitation spectrum of each phosphor was 370 nm and the phosphor emitted blue-green light when excited with 450-nm blue light. The light emitting intensity and the light emission wavelength at the light emission peak of the phosphor powder (Examples 69 to 73) are shown in Table 16. The counted value of the light emitting intensity is based on an arbitrary unit value.

Powder X-ray diffraction patterns consisting of a main diffraction peak were also obtained in Examples 74 to 83 as in Example 1.

The phosphor powder (Examples 74 to 83) was exposed to an environment with a humidity of 80% and a temperature of 80° C. for 100 hours. Substantially no decrease in brightness was observed.

Next, the phosphor powder (Examples 74 to 83) was observed using an optical microscope while irradiating the phosphor powder with a 365-nm ultraviolet ray as needed.

On the basis of color of the samples, particle shape and light emission color when irradiated with ultraviolet light, it was confirmed that the volume ratio of non-light emitting phase consisting of one or more materials selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ $_{(n\sim1)}$) and $SrSi_6N_8$ to a crystal phase which emits light different from blue-green light near 504 nm was not more than 20%.

Examples 84 to 94

A sintered mass obtained in the same manner as in Example 1 was cracked using an agate pestle and mortar and then classified through screening or elutriatation to produce a phosphor powder (Examples 84 to 94) having a desired average particle diameter and an average aspect ratio shown in Table 17.

The obtained phosphor powder (Examples 84 to 94) was dispersed in an amount of 10% by mass into a silicone resin using a kneader. From a cross section of the resin, the light emitting intensity and dispersibility to the resin were evaluated. The light emitting intensity was normalized with the maximum value being 100. The dispersibility into the resin was evaluated with respect to the ratio of the powder particles having voids in an interface of the resin to the powder particles. The smaller the ratio of the powder particles having voids, the higher the dispersibility.

TABLE 17

| | average particle size (μm) | average aspect ratio | light emitting intensity (count) | voidage (%) |
|---|---|---|---|---|
| Example 84 | 0.200 | 1.200 | 77.000 | 5.200 |
| Example 85 | 1.000 | 3.200 | 87.000 | 3.300 |
| Example 86 | 3.000 | 4.100 | 95.000 | 2.300 |
| Example 87 | 6.000 | 4.900 | 98.000 | 2.100 |
| Example 88 | 11.000 | 5.300 | 100.000 | 1.200 |
| Example 89 | 11.100 | 5.800 | 102.000 | 1.300 |
| Example 90 | 12.600 | 6.000 | 98.000 | 1.800 |
| Example 91 | 14.300 | 7.100 | 98.000 | 2.400 |
| Example 92 | 21.000 | 13.600 | 94.000 | 3.200 |
| Example 93 | 33.000 | 16.900 | 87.000 | 3.800 |
| Example 94 | 48.000 | 18.700 | 81.000 | 4.600 |

Examples 95 and 96

The light emitting intensity, the fluorine content and the boron content were examined regarding the phosphor powder (Example 95) and the phosphor powder (Example 96). The phosphor powder (Example 95) was produced in the same manner as in Example 1 except that exclusively 0.5% by mass of lithium fluoride powder was added. The phosphor powder (Example 96) was produced using a graphite crucible. The light emitting intensity was normalized with the light emitting intensity of Example 1 being 100. Since a surface of the sample produced using the graphite crucible was silicon carbonized, evaluation was performed after the silicon carbide layer on the surface was removed.

TABLE 18

| | crucible | fluorine content (ppm) | boron content(ppm) | light emitting intensity (count) |
|---|---|---|---|---|
| Example 95 | hBN | 121.000 | 480.000 | 107.000 |
| Example 96 | graphite | 109.000 | 0.000 | 88.000 |

Example 97

The powder obtained in the same manner as in Example 70 was classified through elutriation to provide a phosphor powder having an average particle diameter of 1.3 μm. The powder was added as a seed in an amount exclusively 2% by mass to the composition of Example 1 to produce the phosphor powder (Example 97) in the same manner as in Example 1.

It was confirmed that the phosphor powder (Example 97) emitted blue-green light when irradiated with a 365-nm light from a UV lamp.

The light emission spectrum and the excitation spectrum of the phosphor powder (Example 97) were measured using a fluorescence spectrophotometer. As a result, the peak wavelength of the excitation spectrum was 370 nm and the peak wavelength of the light emission spectrum was 504 nm (i.e., blue-green) when excited by 450-nm blue light. The light emitting intensity of the light emission peak wavelength was 108 counts when the light emitting intensity of Example 1 was normalized to 100.

The phosphor powder was then ground using an agate mortar and was subject to a powder X diffraction measurement using a Cu—K α-ray. As a result, a powder X-ray diffraction pattern consisting of a main diffraction peak similar to that of Example 1, is obtained.

Example 98

The raw material powder was weighed and a total amount of 100 g was mixed in a wet ball mill for two hours using ethanol as a mixing solvent so that the composition ratio the same as in Example 70 was obtained. A slurry with viscosity of about 300 cps was obtained. The mixing solvent may also be hexane, for example.

The obtained slurry was then spray dried using a spray dryer corresponding to an organic solvent to provide granular powder mixture.

The obtained powder mixture was placed in an aluminum mold and a compact with bulk density of about 24% was fabricated. The compact was then filled in a boron nitride crucible. A ratio of the compact volume and the crucible volume was about 80%. The powder was weighed, mixed and molded in ambient air.

A boron nitride crucible filled up with this powder mixture was set in an electric furnace of graphite resistance heating system which used a carbon fiber compact as thermal insulation material.

In the sintering step, a sintering atmosphere was first vacuumized using a diffusion pump, the powder was heated from room temperature to 1000° C. at a speed of 500° C./h, nitrogen with a purity of 99.999% by volume was introduced at 1000° C., the pressure was controlled to be 0.9 MPa, the temperature was increased to 1900° C. at 600° C./h and the powder was kept at a temperature of 1900° C. for two hours.

After the sintering step, the obtained sintered product was subject to course grinding, grinding by hand in a mortar of a silicon nitride sintered product and then screening using a 30-μm sieve to provide a phosphor powder (Example 98) having an average particle diameter of 11 μm.

It was confirmed that the phosphor powder (Example 98) emitted blue-green light when irradiated with 365-nm light from a UV lamp.

The light emission spectrum and the excitation spectrum of the phosphor powder (Example 98) were measured using a fluorescence spectrophotometer. As a result, the peak wavelength of the excitation spectrum was 370 nm and the peak wavelength of the light emission spectrum was 504 nm (i.e., blue-green) when excited by 450-nm blue light. The light emitting intensity of the light emission peak wavelength was 107 counts when the light emitting intensity of Example 70 was normalized as 100. The phosphor powder was then ground using an agate mortar and was subject to a powder X diffraction measurement using a Cu—K α-ray. As a result, a powder X-ray diffraction pattern consisting of a main diffraction peak similar to that of Example 1, is obtained.

Example 99

The powder mixture used in Example 70 was placed in an aluminum mold and a compact with bulk density of about 25% was fabricated. The compact was then filled into a boron nitride crucible. The ratio of the compact volume to the crucible volume was about 80%. The powder was weighed, mixed and molded in ambient air.

The boron nitride crucible filled with the powder mixture was placed in an electric furnace of a lanthanum chromite resistance heating system in which an alumina fiber compact is used as a thermal insulation material. No material that includes carbon was placed in an electric furnace chamber used in the present embodiment.

In the sintering step, a sintering atmosphere was first vacuumized using a diffusion pump, the powder was heated from room temperature to 1000° C. at a speed of 100° C./h, nitrogen with a purity of 99.999% by volume was introduced at 1000° C., the pressure was controlled to be 0.9 MPa, the temperature was increased to 1900° C. at 100° C./h and the powder was kept at a temperature of 1900° C. for two hours.

After the sintering step, the obtained sintered product was subject to course grinding, grinding by hand in a mortar of a silicon nitride sintered product and then screening using a 30μm sieve to provide a phosphor powder (Example 99) having an average particle diameter of 12 μm.

It was confirmed that the phosphor powder (Example 99) emitted blue-green light when irradiated with 365-nm light from a UV lamp.

A light emission spectrum and an excitation spectrum of the phosphor powder (Example 99) were measured using a fluorescence spectrophotometer. As a result, the peak wavelength of the excitation spectrum was 370 nm and the peak wavelength of the light emission spectrum was 504 nm (i.e., blue-green) when excited by 450-nm blue light. The light emitting intensity of the light emission peak wavelength was 82 counts when the light emitting intensity of Example 98 was normalized to be 100.

The phosphor powder was then ground using an agate mortar was subject to a powder X diffraction measurement using a Cu—K α-ray. As a result, a powder X-ray diffraction pattern consisting of a main diffraction peak similar to that of Example 1, is obtained.

Examples 100 to 109

A powder mixture having the same composition as that of Example 70 was filled in a boron nitride crucible at bulk density and a filling factor shown in Table 19. The powder was weighed, mixed and molded in ambient air.

The boron nitride crucible filled with the powder mixture was placed in an electric furnace of a graphite resistance heating system in which a carbon fiber compact is used as a thermal insulation material.

In the sintering step, a sintering atmosphere was first vacuumized using a diffusion pump, the powder was heated from room temperature to 1000° C. at a speed of 600° C./h, nitrogen with a purity of 99.999% by volume was introduced at 1000° C., the pressure was controlled to be 0.9 MPa, the temperature was increased to 1900° C. at 600° C./h and the powder was kept at a temperature of 1900° C. for two hours.

After the sintering step, the obtained sintered product was subject to course grinding, grinding by hand in a mortar of a silicon nitride sintered product and then screening using a 30-μm sieve to provide a phosphor powder (Examples 100 to 109) having an average particle diameter of about 12 μm.

It was confirmed that the phosphor powder (Examples 100 to 109) emitted blue-green light when irradiated with a 365-nm light from a UV lamp.

The light emission spectrum and the excitation spectrum of the phosphor powder (Examples 100 to 109) were measured using a fluorescence spectrophotometer. As a result, the peak wavelength of the excitation spectrum was 370 nm and the peak wavelength of the light emission spectrum was 504 nm (i.e., blue-green) when excited by a 450-nm blue light. The light emitting intensity of the phosphor powder (Examples 100 to 109) was normalized with the light emitting intensity of Example 70 being 100.

TABLE 19

|  | bulk density (%) | filling factor (%) | light emitting intensity (count) |
| --- | --- | --- | --- |
| Example 100 | 7 | 79 | 104 |
| Example 101 | 16 | 80 | 102 |
| Example 102 | 25 | 79 | 103 |
| Example 103 | 24 | 13 | 75 |
| Example 104 | 25 | 24 | 81 |
| Example 105 | 24 | 50 | 90 |
| Example 106 | 24 | 73 | 98 |
| Example 107 | 31 | 80 | 97 |
| Example 108 | 40 | 80 | 94 |
| Example 109 | 48 | 80 | 83 |

Examples 110 and 111

The phosphor powder obtained in Example 70 was ground with ethanol as a solvent using a ball mill consisting of material shown in Table 20 so that the average particle diameter is not more than 5 μm. After the obtained slurry was made to evaporate, the sample of Example 111 was washed with chloride, made to evaporate and then filled in a boron nitride crucible.

The boron nitride crucible filled with a sample was placed in an electric furnace of a graphite resistance heating system in which a carbon fiber compact is used as a thermal insulation material.

In the sintering step, a sintering atmosphere was first vacuumized using a diffusion pump, the powder was heated from a room temperature to 1000° C. at a speed of 600° C./h, nitrogen with a purity of 99.999% by volume was introduced at 1000° C., the pressure was controlled to be 0.9 MPa, the temperature was increased to 1900° C. at 600° C./h and the powder was kept at a temperature of 1900° C. for two hours.

After the sintering step, the obtained sintered product was subject to course grinding, grinding by hand in a mortar of a silicon nitride sintered product and then screening using a 30-μm sieve to provide a phosphor powder (Examples 110 and 111) having an average particle diameter of about 12 μm.

It was confirmed that the phosphor powder (Examples 110 and 111) emitted a blue-green light when irradiated with a 365-nm light from a UV lamp.

A light emission spectrum and an excitation spectrum of the phosphor powder (Examples 110 and 111) were measured using a fluorescence spectrophotometer. As a result, the peak wavelength of the excitation spectrum was 370 nm and the peak wavelength of the light emission spectrum was 504 nm (i.e., blue-green) when excited by a 450-nm blue light. The light emitting intensity of the phosphor powder (Examples 110 to 111) was normalized with the light emitting intensity of Example 70 being 100.

TABLE 20

| | grinding ball, lining material | light emitting intensity (count) |
|---|---|---|
| Example 110 | silicon nitride sintered product | 115 |
| Example 111 | iron | 75 |

Examples 112 and 113

The phosphor powder obtained in Example 70 was filled in a boron nitride crucible. The boron nitride crucible filled with the sample was placed in a hot isostatic press device of a graphite resistance heating system in which a carbon fiber compact is used as a thermal insulation material.

The crucible was then heated at an atmosphere pressure of 30 MP and at a sintering temperature of 2000° C. (Example 112), or at atmosphere pressure of 50 MPa and at a sintering temperature of 2100° C. (Example 113). The sintering atmosphere was a nitrogen atmosphere.

After the sintering step, the obtained sintered product was subject to course grinding, grinding by hand in a mortar of a silicon nitride sintered product and then screening using a 30-μm sieve to provide phosphor powder (Examples 112 and 113) having an average particle diameter of about 11 μm.

It was confirmed that the phosphor powder (Examples 112 and 113) emitted blue-green light when irradiated with a 365-nm light from a UV lamp.

The light emission spectrum and the excitation spectrum of the phosphor powder (Examples 112 and 113) were measured using a fluorescence spectrophotometer. As a result, the peak wavelength of the excitation spectrum was 370 nm and the peak wavelength of the light emission spectrum was 504 nm (i.e., blue-green) when excited by a 450-nm blue light. The light emitting intensity of the phosphor powder (Examples 112 and 113) was normalized with a light emitting intensity of Example 70 being 100.

TABLE 21

| | atmosphere pressure (MPa) | sintering temperature (° C.) | light emitting intensity (count) |
|---|---|---|---|
| Example 112 | 30 | 2000 | 112 |
| Example 113 | 50 | 2100 | 117 |

Example 114

5.0 g of the phosphor powder obtained in Example 70 was well dispersed in a mixture solution of 50 ml of isopropyl alcohol and 20 ml of distilled water in which 1.0 g of tetraethoxy silane is dissolved. 50 ml of a 15% aqueous ammonia solution was added dropwise to the mixture solution while stirring the dispersed solution sufficiently. The mixture solution was then heated to reflux while being stirred for two hours. The obtained slurry was screened, washed and dried. The slurry was temporarily sintered at 600° C. in a nitrogen atmosphere to obtain an amorphous silica-coated phosphor (Example 114).

The obtained amorphous silica-coated phosphor (Example 114) was observed with a transmission electron microscope to find that the thickness of the silica film was about 70 nm. The light emitting intensity of the fluorescent material (Example 114) was normalized to be 114 with the light emitting intensity of Example 70 being 100. The refractive index of the obtained silica coating was measured to be 1.48 in the same manner described above. The oxygen content of the amorphous silica-coated phosphor (Example 114) was larger than the oxygen content theoretically calculated in Example 70 by 0.2% by mass.

Example 115

To 50 ml of a 0.1M boric acid-0.1M potassium chloride aqueous solution, 32 ml of a 0.1M sodium hydroxide aqueous solution was added. The mixed solution was then diluted with distilled water to provide 100 ml of a distilled solution. To this solution, 5.0 g of the phosphor powder obtained in Example 70 was added and dispersed enough to provide a slurry.

To the slurry, 10 ml of a 0.1M aluminum sulfate aqueous solution was added dropwise while keeping the pH of the slurry in a range of 9.0 to 10.5 with a sodium hydroxide aqueous solution. In this manner, phosphor particles with aluminum hydroxide fine particles adhering to surfaces of particles in the slurry were obtained. The obtained phosphor particles were rinsed and dried. Then the phosphor particles were temporarily sintered for two hours in ambient air at a temperature of 600° C. to provide an alumina-coated phosphor powder (Example 115).

The phosphor powder (Example 115) was observed with a transmission electron microscope to determine that the thickness of the alumina layer was about 50 nm. The light emitting intensity of the phosphor powder (Example 115) was 110 when the light emitting intensity of Example 70 was normalized to 100. The refractive index of the obtained alumina coating was measured to be 1.70 in the same manner described above. The oxygen content of the alumina-coated phosphor powder (Example 115) was larger than the oxygen content theoretically calculated in Example 70 by 0.3% by mass.

Example 116

The sintered mass of the phosphor obtained in the same manner as in Example 70 was lightly cracked using a mortar of a silicon nitride sintered product. The sintered mass was subject to an acid treatment for 30 minutes while being stirred sufficiently using a mixed acid aqueous solution, in which 48%-concentration hydrofluoric acid, normal 36N-concentration sulfuric acid and distilled water were mixed to one another at a volume ratio of 5:5:390. The phosphor powder was then separated, washed, dried and processed to provide phosphor powder (Example 116).

The configuration of the phosphor powder (Example 116) was observed using a scanning electron microscope to confirm that neither a grain boundary phase nor a glass second phase was observed and that the phosphor powder was constituted only by single crystal particles which has an idiomorphic face.

It was confirmed that the phosphor powder (Example 116) emitted blue-green light when irradiated with a 365-nm light from a UV lamp.

The light emission spectrum and the excitation spectrum of the phosphor powder (Example 116) were measured using a fluorescence spectrophotometer. As a result, the peak wavelength of the excitation spectrum was 370 nm and the peak wavelength of the light emission spectrum was 504 nm (i.e., blue-green) when excited by 450-nm blue light. The light emitting intensity of the phosphor powder (Example 116) was 116 when the light emitting intensity of Example 70 was normalized as 100.

Next, a light-emitting device using the phosphor according to the invention will be described.

Example 117

A round-type white light emitting diode lamp (i.e., a light-emitting device) as illustrated in FIG. 1 was fabricated using the phosphor according to the invention.

First, a blue light emitting diode device was bonded on a recess for mounting the device on a first lead wire with conductive paste. The first lead wire and a lower electrode of the blue light emitting diode device were electrically connected to each other. The blue light emitting diode device was thus fixed. Next, an upper electrode and a second lead wire of the blue light emitting diode device were wire-bonded with bonding wire so as to be electrically connected to each other.

Then, a proper amount of previously produced, phosphor-dispersed resin was coated on the recess to cover the blue light emitting diode device using a dispenser. The resin was then cured to provide first resin.

Finally, a tip of the first lead wire which includes a recess, the blue light emitting diode device and the entire phosphor-dispersed first resin were altogether sealed with the second resin by a casting method.

The first resin was an epoxy resin having a refractive index of 1.6. The second resin was an epoxy resin having a refractive index of 1.36.

In the present embodiment, 15% by mass of the phosphor of Example 1 as a blue-green phosphor and 26% by mass of a $CaAlSiN_3$:Eu phosphor as a red phosphor were mixed to epoxy resin in the concentration described above. The mixture was added dropwise using a dispenser to provide phosphor-dispersed first resin.

When current is applied to a conductive terminal, the LED device emitted blue light with a 450-nm light emission peak wavelength. The blue light excited the phosphor of Example 1 and the red phosphor to cause the phosphors to emit blue-green light and red light, respectively. The emitted light were mixed together to provide white light.

Example 118

A round-type white light emitting diode lamp (i.e., a light-emitting device) as illustrated in FIG. 1 was produced in the same manner as in Example 117 except that another phosphor was used.

In the present embodiment, 15% by mass of the phosphor of Example 1 as a blue-green phosphor, 12% by mass of a β-sialon phosphor as a green phosphor and 26% by mass of a $CaAlSiN_3$:Eu phosphor as a red phosphor were mixed into an epoxy resin in the concentration described above. The mixture was added dropwise using a dispenser to provide a phosphor-dispersed first resin.

When current is applied to a conductive terminal, the LED device emitted blue light with a 450-nm light emission peak wavelength. The blue light excited the phosphor of Example 1, the green phosphor and the red phosphor to cause the phosphors to emit blue-green light, green light and red light, respectively. The emitted light was mixed together to provide white light.

Example 119

A round-type white light emitting diode lamp (i.e., a light-emitting device) as illustrated in FIG. 1 was fabricated in the same manner as in Example 117 except that another phosphor was used.

In the present embodiment, 15% by mass of the phosphor of Example 1 as a blue-green phosphor, 13% by mass of $Ca_3Sc_2Si_3O_{12}$:Ce phosphor as a green phosphor, and 26% by mass of a $CaAlSiN_3$:Eu phosphor as a red phosphor were mixed into an epoxy resin in the concentration described above. The mixture was added dropwise using a dispenser to provide phosphor-dispersed first resin.

When current was applied to a conductive terminal, the LED device emitted blue light with a 450-nm light emission peak wavelength. The blue light excited the phosphor of Example 1, the green phosphor and the red phosphor to cause the phosphors to emit blue-green light, green light and red light, respectively. The emitted light was mixed together to provide white light.

Example 120

A round-type white light emitting diode lamp (i.e., a light-emitting device) as illustrated in FIG. 1 was fabricated in the same manner as in Example 117 except that another phosphor was used.

In the present embodiment, 15% by mass of the phosphor of Example 1 as a blue-green phosphor, 13% by mass of a β-sialon phosphor as a green phosphor, 18% by mass of a YAG:Ce phosphor as a yellow phosphor and 26% by mass of a $CaAlSiN_3$:Eu phosphor as a red phosphor were mixed into an epoxy resin in the concentration described above. The mixture was added dropwise using a dispenser to provide a phosphor-dispersed first resin.

When current was applied to a conductive terminal, the LED device emitted blue light with a 450-nm light emission peak wavelength. The blue light excited the phosphor of Example 1, the green phosphor, the yellow phosphor and the red phosphor to cause the phosphors to emit blue-green light, green light, yellow light and red light, respectively. The emitted light was mixed together to provide a white light close to natural light.

Example 121

A round-type LED lamp (i.e., a light-emitting device) as illustrated in FIG. 1 was produced in the same manner as in Example 117 except that another light-emitting device (i.e., another LED) and another phosphor were used.

An ultraviolet LED device having a 380-nm light emission peak wavelength was used as a light-emitting device (i.e., a LED). The phosphor of Example 1, the phosphor of Example 44, a $BaMgAl_{10}O_{17}$:Eu phosphor and $CaAlSiN_3$:Eu as a red phosphor were dispersed in a resin layer consisting of silicone resin. The resin layer was disposed to cover the ultraviolet LED device.

When current was applied to a conductive terminal, the LED device emitted ultraviolet light with a 380-nm light emission peak wavelength. The blue light excited the phosphor of Example 1, the phosphor of Example 44, the $BaMgAl_{10}O_{17}$:Eu phosphor, and red phosphor to cause the phosphors to emit blue-green light, green light, yellow light and red light, respectively. The emitted light was mixed together to provide white light.

Example 122

A round-type white light emitting diode lamp (i.e., a light-emitting device) as illustrated in FIG. 1 was fabricated in the same manner as in Example 117 except that a silicone resin having a refractive index of 1.51 was used as the first resin, a silicone resin having a refractive index of 1.41 was used as the second resin and another phosphor was used.

In the present embodiment, 15% by mass of the phosphor of Example 1 as a blue-green phosphor and 26% by mass of a $CaAlSiN_3$:Eu phosphor as a red phosphor were mixed into a silicone resin in the concentration described above. The mixture was added dropwise using a dispenser to provide a phosphor-dispersed first resin.

When current was applied to a conductive terminal, the LED device emitted blue light with a 450-nm light emission peak wavelength. The blue light excited the phosphor of Example 1 and the red phosphor to cause the phosphors to emit blue-green light and red light, respectively. The emitted light was mixed together to provide white light.

Example 123

A round-type white light emitting diode lamp (i.e., a light-emitting device) as illustrated in FIG. 1 was fabricated in the same manner as in Example 117 except that a silicone resin having a refractive index of 1.51 was used as the first resin, a silicone resin having a refractive index of 1.41 was used as the second resin and another phosphor was used.

In the present embodiment, 15% by mass of the phosphor of Example 1 as a blue-green phosphor, 12% by mass of a β-sialon phosphor as a green phosphor, and 26% by mass of a $CaAlSiN_3$:Eu phosphor as a red phosphor were mixed into a silicone resin in the concentration described above. The mixture was added dropwise using a dispenser to provide a phosphor-dispersed first resin.

When current was applied to a conductive terminal, the LED device emitted blue light with a 450-nm light emission peak wavelength. The blue light excited the phosphor of Example 1, the green phosphor and the red phosphor to emit blue-green light, green light and red light, respectively. The emitted light was mixed together to provide white light.

Example 124

A round-type white light emitting diode lamp (i.e., a light-emitting device) as illustrated in FIG. 1 was fabricated in the same manner as in Example 117 except that a silicone resin having a refractive index of 1.51 was used as the first resin, a silicone resin having a refractive index of 1.41 was used as the second resin and another phosphor was used.

In the present embodiment, 15% by mass of the phosphor of Example 1 as a blue-green phosphor, 13% by mass of $Ca_3Sc_2Si_3O_{12}$:Ce phosphor as a green phosphor, and 26% by mass of a $CaAlSiN_3$:Eu phosphor as a red phosphor were mixed into a silicone resin in the concentration described above. The mixture was added dropwise using a dispenser to provide a phosphor-dispersed first resin.

When current was applied to a conductive terminal, the LED device emitted blue light with a 450-nm light emission peak wavelength. The blue light excited the phosphor of Example 1, the green phosphor, and the red phosphor, to emit blue-green light, green light and red light, respectively. The emitted light was mixed together to provide white light.

Example 125

A round-type white light emitting diode lamp (i.e., a light-emitting device) as illustrated in FIG. 1 was fabricated in the same manner as in Example 117 except that a silicone resin having a refractive index of 1.51 was used as the first resin, a silicone resin having a refractive index of 1.41 was used as the second resin and another phosphor was used.

In the present embodiment, 15% by mass of the phosphor of Example 1 as a blue-green phosphor, 13% by mass of a β-sialon phosphor as a green phosphor, 18% by mass of an α-sialon sialon phosphor as a yellow phosphor, and 26% by mass of a $CaAlSiN_3$:Eu phosphor as a red phosphor, were mixed into a silicone resin in the concentration described above. The mixture was added dropwise using a dispenser to provide a phosphor-dispersed first resin.

When current is applied to a conductive terminal, the LED device emitted blue light with a 450-nm light emission peak wavelength. The blue light excites the phosphor of Example 1, the green phosphor, the yellow phosphor, and the red phosphor to emit blue-green light, green light, yellow light and red light, respectively. The emitted light was mixed together to provide a white light close to natural light.

Example 126

A round-type white light emitting diode lamp (i.e., a light-emitting device) as illustrated in FIG. 1 was fabricated in the same manner as in Example 117 except that a silicone resin having a refractive index of 1.51 was used as the first resin, a silicone resin having a refractive index of 1.41 was used as the second resin and another phosphor was used.

In the present embodiment, 15% by mass of the phosphor of Example 1 as a blue-green phosphor, 13% by mass of a β-sialon phosphor as a green phosphor, 18% by mass of a YAG:Ce phosphor as a yellow phosphor, and 26% by mass of a $CaAlSiN_3$:Eu phosphor as a red phosphor were mixed into a silicone resin in the concentration described above. The mixture was added dropwise using a dispenser to provide a phosphor-dispersed first resin.

When current is applied to a conductive terminal, the LED device emitted blue light with a 450-nm light emission peak wavelength. The blue light excited the phosphor of Example 1, the green phosphor, the yellow phosphor and the red phosphor to emit blue-green light, green light, yellow light and red light, respectively. The emitted light was mixed together to provide a white light close to natural light.

Example 127

A chip-type white light emitting diode lamp for mounting a substrate (i.e., a light-emitting device) as illustrated in FIG. 2 was fabricated using the phosphor according to the invention.

First, a blue light emitting diode was disposed at substantially a center of an alumina ceramic substrate to which a first lead wire and a second lead wire were connected. A lower electrode of the blue light emitting diode was connected to the first lead wire. An upper electrode of the blue light emitting diode was connected to the second lead wire with a bonding wire. A wall surface member having a recess was disposed on a surface of the alumina ceramic substrate at the side of the light-emitting device. The wall surface member was fixed so that the light-emitting device was disposed in the recess. Next, a first resin (i.e., sealing resin) was formed so as to cover the blue light emitting diode. Then, a second resin (i.e., another sealing resin) including no phosphor was formed so as to cover the first resin and to fill the recess.

The light emitting diode lamp was fabricated in the same manner as in Example 10 except that the first lead wire, the second lead wire and the wall surface member were fixed into the alumina ceramic substrate.

In the present embodiment, the wall surface member was made of a white silicone resin and the first resin and the second resin were made of the same epoxy resin.

The phosphor of Example 1 was used as a phosphor, the phosphor of Example 44 was used as a green phosphor and a CaAlSiN$_3$:Eu phosphor was used as a red phosphor. It was confirmed that white light was emitted when the current was applied to the conductive terminal.

Example 128

A chip-type white light emitting diode lamp (i.e., a light-emitting device) as illustrated in FIG. 3 was fabricated.

First, a blue light emitting diode (i.e., a blue LED chip) having a 450-nm light emission peak was die-bonded using resin paste to a lead frame of a case for an LED package for mounting a substrate. The case included a silver-plated copper lead frame and is formed by a substrate molded with a nylon resin and a reflector. Three 350 μm-sided blue light-emitting diodes were mounted.

Next, two electrodes of an upper side of the blue light emitting diode were connected to two bonding wires (i.e., fine gold wires). One of the bonding wires was connected to a lead frame and another of the bonding wires was connected to another lead frame.

Next, a phosphor-containing methyl silicone resin was dropped and cured in a proper amount so as to cover the light emitting diode device and to fill the recess of the wall surface member. A light-emitting device package was then trimmed out of an integrated member. Individual light-emitting device packages were sorted out regarding color tone and light emitting intensity. In this manner, a chip-type white light emitting diode lamp was provided.

In the present embodiment, the phosphor of Example 1 and a sialon phosphor were used as phosphors. It was confirmed that the light-emitting device emitted a white light with a color temperature of about 5500K at a light emission efficiency of 100 lm/W.

A color rendering index of the light-emitting device was about 90 in Ra. The electric power used was 0.18 W per package and the electric power density was $2 \times 10^4$ W/m$^2$ in plane area density per package.

Example 129

A chip-type white light emitting diode lamp (i.e., a light-emitting device) as illustrated in FIG. 3 was fabricated in the same manner as Example 128 using an ultraviolet LED chip as a light emitting diode device, forming a Cu pattern on a ceramic-molded substrate through printed wiring and using a case for LED package to be mounted on a surface mounting to which a ceramic reflector was attached except that another phosphor was employed.

In the present embodiment, the phosphor of Example 1, a sialon phosphor and a CaAlSiN-based phosphor were used as phosphors. It was confirmed that the light-emitting device emitted white light with a color temperature of about 5600K at a light emission efficiency of 120 lm/W.

The color rendering index of the light-emitting device was about 98 in Ra. The electric power used was 0.18 W per package and the electric power density was $2 \times 10^4$ W/m$^2$ in plane area density per package.

Example 130

A chip-type white light emitting diode lamp (i.e., a light-emitting device) as illustrated in FIG. 3 was fabricated in the same manner as in Example 128 using a blue light-emitting diode (i.e., a blue LED chip) which has a light emission peak at 440 nm as a light emitting diode device except that a 1-mm sided large chip was mounted.

In the present embodiment, the phosphor of Example 1 and a sialon phosphor were used as phosphors. It was confirmed that the light-emitting device emitted white light with a color temperature of about 5000K at a light emission efficiency of 90 lm/W.

A color rendering index of the light-emitting device was about 87 in Ra. The electric power used was 1 W per package and the electric power density was $1 \times 10^3$ W/m$^2$ in plane area density per package.

Example 131

A chip-type white light emitting diode lamp (i.e., a light-emitting device) as illustrated in FIG. 4 was fabricated in the same manner as Example 128 using a blue light-emitting diode (i.e., a blue LED chip) which has a light emission peak at 470 nm as a light emitting diode device except that a second resin with no phosphor dispersed therein was formed.

Phenyl silicone resin including no phosphor was used as the second resin.

In the present embodiment, the phosphor of Example 1 and a sialon phosphor were used as phosphors. It was confirmed that the light-emitting device emitted a white light with a color temperature of about 5200K at a light emission efficiency of 110 lm/W.

The color rendering index of the light-emitting device was about 93 in Ra. The electric power used was 0.18 W per package and electric power density was $2 \times 10^4$ W/m$^2$ in plane area density per package.

Example 132

A chip-type white light emitting diode lamp (i.e., a light-emitting device) as illustrated in FIG. 5 was fabricated in the same manner as Example 128 except that no first resin was formed, a 10 μm-thick phosphor layer according to the invention was formed by a sputtering process on a transparent p-electrode of a blue light-emitting diode (i.e., a blue LED chip) and second resin in which no phosphor is dispersed was formed.

In the present embodiment, the phosphor of Example 1 and a sialon phosphor were used as phosphors. It was confirmed that the light-emitting device emitted a white light with a color temperature of about 4500K at light emission efficiency of 140 lm/W.

A color rendering index of the light-emitting device was about 85 in Ra. The electric power used was 0.18 W per package and the electric power density was $2 \times 10^4$ W/m$^2$ in plane area density per package.

Example 133

A blue light-emitting diode (i.e., a blue LED chip) was mounted directly on a printed wired glass-containing epoxy substrate and the LED chip was sealed with resin. In this manner, a Chip On Board (COB) white light emitting diode (i.e., a light-emitting device) was fabricated.

The blue light-emitting diode (i.e., the blue LED chip) was mounted on an aluminum substrate and a printed wired glass-containing epoxy substrate was superimposed on and made to adhere to the LED chip.

The substrate has a hole at a site where the blue light-emitting diode (i.e., the blue LED chip) was mounted. The blue light-emitting diode (i.e., the blue LED chip) was exposed through the hole. The blue light-emitting diode (i.e., the blue LED chip) and wiring were connected by gold wire. A proper amount of phosphor-containing methyl silicone resin was added dropwise and made to cure on the LED chip.

In the present embodiment, the phosphor of Example 1 and a sialon phosphor were used as phosphors. It was confirmed that the light-emitting device emitted warm white light with a color temperature of about 5500K at light emission efficiency of 100 lm/W. A color rendering index of the light-emitting device was about 90 in Ra.

Example 134

A chip-type white light emitting diode lamp (i.e., a light-emitting device) as illustrated in FIG. 3 was fabricated in the same manner as Example 128 except that an ultraviolet LED (i.e. an ultraviolet LED chip) having a light emission peak at 390 nm was used as the light emitting diode device, a Cu pattern was formed on a ceramic-molded substrate as printed wiring, a case for LED package to be mounted on a surface mounting to which a ceramic reflector was attached was used and another phosphor was employed.

In the present embodiment, only the phosphor of Example 49 was used as a phosphor. Radiant power output of light-emitting device was 18 mW. Almost no variation in the light emission wavelength with respect to the current amount was observed as the current was varied from 100 microA to 50 mA.

Example 135

A chip-type white light emitting diode lamp (i.e., a light-emitting device) as illustrated in FIG. 3 was fabricated in the same manner as Example 128 except that an ultraviolet LED (i.e. an ultraviolet LED chip) having a light emission peak at 390 nm was used as the light emitting diode device, a Cu pattern was formed on a ceramic-molded substrate as printed wiring, a case for LED package to be mounted on a surface mounting to which a ceramic reflector was attached was used and that another phosphor was employed.

In the present embodiment, only the phosphor of Example 57 was used as a phosphor. Radiant power output of light-emitting device was 40 mW. Almost no variation in the light emission wavelength with respect to the current amount was observed as the current was varied from 100 microA to 50 mA.

Example 136

A chip-type white light emitting diode lamp (i.e., a light-emitting device) as illustrated in FIG. 3 was fabricated in the same manner as in Example 128 except that an ultraviolet LED (i.e. an ultraviolet LED chip) having a light emission peak at 390 nm was used as the light emitting diode device, a Cu pattern was formed on a ceramic-molded substrate as the printed wiring, a case for LED package to be mounted on a surface mounting to which a ceramic reflector was attached was used and another phosphor was employed.

In the present embodiment, only phosphor of Example 1 was used as a phosphor. The radiant power output of light-emitting device was 35 mW. Almost no variation in the wavelength with respect to the current amount was observed as the current was varied from 100 microA to 50 mA.

Example 137

A chip-type white light emitting diode lamp (i.e., a light-emitting device) as illustrated in FIG. 3 was fabricated in the same manner in Example 128 except that another phosphor was employed.

In the present embodiment, the phosphor of Example 1, a sialon phosphor and a CaAlSiN phosphor were used as phosphors. It was confirmed that the light-emitting device emitted a white light with a color temperature of about 5300K at a light emission efficiency of 120 lm/W.

The color rendering index of the light-emitting device was about 96 in Ra. The electric power used was 0.18 W per package and the electric power density was $2 \times 10^4$ W/m$^2$ in plane area density per package.

Example 138

A chip-type white light emitting diode lamp (i.e., a light-emitting device) as illustrated in FIG. 3 was fabricated in the same manner in Example 128 except that another phosphor was employed.

In the present embodiment, a mixture of the phosphors of Examples 29 to 68 and a CaAlSiN phosphor was used as a phosphor. It was confirmed that the light-emitting device emitted a white light with a color temperature of about 5500K at a light emission efficiency of 100 lm/W. The color rendering index of the light-emitting device was about 99 in R$^a$. The electric power used was 0.18 W per package and the electric power density was $2 \times 10^4$ W/m$^2$ in plane area density per package.

Industrial Applicability

The phosphor according to the invention is a nitride phosphor which has a higher light emitting intensity, which has an excellent property as a phosphor and of which the brightness is hardly impaired when exposed to an excitation source as compared to related art sialon phosphors and oxynitride phosphors. The phosphor is thus suitably used in a white LED, an inorganic electroluminescence and an organic electroluminescence. It is expected that the phosphor will be widely used in material design of light-emitting devices, such as various lighting devices and display devices in the future to significantly contribute to industrial development.

The invention claimed is:

1. A phosphor which comprises a phosphor material having a composition represented by a general formula: $M(0)_a M(1)_b M(2)_{x-(vm+n)} M(3)_{(vm+n)-y} O_n N_{z-n}$, wherein
   M(0) is one or more elements selected from Li, Na, Be, Mg, Ca, Sr, Ba, Sc, Y, La, Gd, and Lu;
   M(1) Eu;
   M(2) is one or more elements selected from Si, Ge, Sn, Ti, Hf and Zr;
   M(3) is one or more elements selected from Be, B, Al, Ga, In, Tl and Zn;
   O is oxygen;
   N is nitrogen; and
   an atomic ratio of M(0), M(1), M(2), M(3), O and N is adjusted to satisfy the following:
   x, y and z satisfy $33 \leq x \leq 51$, $8 \leq y \leq 12$ and $36 \leq z \leq 56$;
   a and b satisfy $3 \leq a+b \leq 7$ and $0.001 \leq b \leq 1.2$;
   m and n satisfy $0.8 \cdot me \leq m \leq 1.2 \cdot me$ and $0 \leq n \leq 7$ in which $me = a+b$; and
   v satisfies $v = \{a \cdot v(0) + b \cdot v(1)\}/(a+b)$, wherein $v(0)$ is a valence of M(0) ion and $v(1)$ is a valence of M(1) ion, and
   wherein the phosphor emits 480 to 540-nm light.

2. The phosphor according to claim 1, wherein $x=42$, $y=10$ and $z=46$.

3. The phosphor according to claim 1, wherein M(0) is one or more elements selected from Ca, Sr and Ba.

4. The phosphor according to claim 1, wherein M(2) is Si and M(3) is Al.

5. The phosphor according to claim 1, wherein $n \leq me$.

6. The phosphor according to claim 1, wherein the content of the phosphor material is not less than 80% by volume and the remainder is one or more selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1) and $SrSi_6N_8$.

7. The phosphor according to claim 1, wherein a transparent film is formed at least partially on a surface of the phosphor and a thickness of the transparent film is (10 to 180 )/$n_k$ (nanometers) when the refractive index of the transparent film is $n_k$.

8. A light-emitting device comprising a light emitting source and a phosphor, wherein the phosphor is the phosphor according to claim 1.

9. The light-emitting device according to claim 8, comprising a light emitting source and a phosphor, wherein the phosphor further comprises $CaAlSiN_3$:Eu.

10. The light-emitting device according to claim 8, wherein the light emitting source is one of a LED chip, an inorganic EL chip or an organic EL chip, each of which emits light at a wavelength of 330 to 500 nm.

11. The light-emitting device according to claim 8, wherein the phosphor is dispersed in a sealing resin formed to surround the LED chip.

12. The light-emitting device according to claim 10, wherein the phosphor is attached directly to the LED chip.

13. The light-emitting device according to claim 10, wherein the light-emitting device comprises a plurality of LED chips.

14. The phosphor according to claim 1, wherein, in powder X-ray diffraction measurement of the phosphor, at least one of the top five strongest diffraction lines selected from the X-ray diffraction pattern, has a diffraction angle (2θ) ranging from 25° to 27°.

* * * * *